United States Patent
Park

(10) Patent No.: US 7,612,373 B2
(45) Date of Patent: Nov. 3, 2009

(54) LIQUID CRYSTAL DISPLAY DEVICE AND METHOD OF MANUFACTURING LIQUID CRYSTAL DISPLAY DEVICE WITH COLOR FILTER LAYER ON THIN FILM TRANSISTOR

(75) Inventor: Jong-Jin Park, Annyang-Si (KR)

(73) Assignee: LG Display Co., Ltd., Seoul (KR)

( * ) Notice: Subject to any disclaimer, the term of this patent is extended or adjusted under 35 U.S.C. 154(b) by 228 days.

(21) Appl. No.: 11/169,021

(22) Filed: Jun. 29, 2005

(65) Prior Publication Data
US 2006/0006385 A1 Jan. 12, 2006

(30) Foreign Application Priority Data
Jun. 30, 2004 (KR) .................. 10-2004-0050171
Feb. 4, 2005 (KR) .................. 10-2005-0010589

(51) Int. Cl.
*H01L 31/00* (2006.01)
(52) U.S. Cl. .................. 257/59; 257/72
(58) Field of Classification Search .................. 257/59, 257/72
See application file for complete search history.

(56) References Cited

U.S. PATENT DOCUMENTS

| | | | |
|---|---|---|---|
| 6,118,505 A * | 9/2000 | Nagata et al. .................. 349/106 |
| 6,697,138 B2 * | 2/2004 | Ha et al. .................. 349/114 |
| 6,879,359 B1 * | 4/2005 | Kikkawa et al. .................. 349/113 |
| 2001/0052952 A1 * | 12/2001 | Choo et al. .................. 349/43 |
| 2002/0044240 A1 * | 4/2002 | Choo et al. .................. 349/113 |
| 2002/0085140 A1 * | 7/2002 | Ko .................. 349/43 |
| 2002/0109811 A1 * | 8/2002 | Park et al. .................. 349/113 |
| 2004/0007704 A1 * | 1/2004 | Kim .................. 257/59 |
| 2004/0109101 A1 * | 6/2004 | Kim et al. .................. 349/44 |
| 2004/0179157 A1 * | 9/2004 | Kim et al. .................. 349/114 |
| 2004/0195573 A1 * | 10/2004 | Kim .................. 257/72 |
| 2005/0140875 A1 * | 6/2005 | Jeoung et al. .................. 349/114 |

FOREIGN PATENT DOCUMENTS

| JP | 2001-100652 A | 4/2001 |
| JP | 2002-055363 A | 2/2002 |
| JP | 2003-029297 A | 1/2003 |

* cited by examiner

*Primary Examiner*—Kenneth A Parker
*Assistant Examiner*—Anthony Ho
(74) *Attorney, Agent, or Firm*—Birch, Stewart, Kolasch & Birch, LLP

(57) ABSTRACT

A method of fabricating a liquid crystal display device is provided. The method of fabricating a liquid crystal display device includes forming a thin film transistor including a source electrode and a drain electrode on a substrate, forming a first passivation layer on the substrate, forming a black matrix on the first passivation layer, forming a color filter layer on the first passivation layer in the pixel region, and forming a pixel electrode above the color filter layer and the black matrix by using a single mask.

5 Claims, 43 Drawing Sheets

LIQUID CRYSTAL DISPLAY DEVICE AND METHOD OF MANUFACTURING LIQUID CRYSTAL DISPLAY DEVICE WITH COLOR FILTER LAYER ON THIN FILM TRANSISTOR

This Nonprovisional application claims priority under 35 U.S.C. §119(a) on Patent Application No. 2004-0050171 filed in Korea on Jun. 30, 2004 and Patent Application No. 2005-0010589 filed in Korea on Feb. 4, 2005, the entire contents of which are hereby incorporated by reference.

BACKGROUND OF THE INVENTION

1. Field of the Invention

The present invention relates to a liquid crystal display device, and more particularly, to a manufacturing method of an array substrate for a liquid crystal display device having a color filter layer on a thin film transistor.

2. Discussion of the Related Art

A liquid crystal display (LCD) device is driven based on the optical anisotropy and polarization characteristics of a liquid crystal material. In general, the LCD device includes two substrates spaced apart and facing each other with a liquid crystal material layer interposed between the two substrates. Each of the substrates includes electrodes facing each other such that a voltage applied to each electrode induces an electric field between the electrodes perpendicular to the substrates. An alignment of liquid crystal molecules of the liquid crystal material layer changes by varying an intensity or direction of the applied electric field. Accordingly, the LCD device displays an image by varying light transmittance through the liquid crystal material layer in accordance with the arrangement of the liquid crystal molecules.

FIG. 1 is an expanded perspective view illustrating a related art LCD device. As shown in FIG. 1, the LCD device 11 includes an upper substrate 5, referred to as a color filter substrate, a lower substrate 22, referred to as an array substrate, and a liquid crystal material layer 14 interposed therebetween. On the upper substrate 5, a black matrix 6 and a color filter layer 8 are formed in a shape of an array matrix including a plurality of red (R), green (G), and blue (B) color filters surrounded by corresponding portions of the black matrix 6. Additionally, a common electrode 18 is formed on the upper substrate 5 to cover the color filter layer 8 and the black matrix 6.

On the lower substrate 22, a plurality of thin film transistors (TFTs) T are formed as an array matrix corresponding to the color filter layer 8. A plurality of gate lines 13 perpendicularly cross a plurality of data lines 15. The TFTs T are positioned such that each TFT T is located adjacent to an intersection of one of the gate lines 13 and one of the data lines 15. Furthermore, a plurality of pixel electrodes 17 are formed on a pixel region P defined by the gate lines 13 and the data lines 15 of the lower substrate 22. The pixel electrode 17 includes a transparent conductive material having high transmittance, such as indium-tin-oxide (ITO) or indium-zinc-oxide (IZO).

As further shown in FIG. 1, a storage capacitor $C_{ST}$ is disposed in each pixel and connected in parallel to the pixel electrode 17 of the pixel. The storage capacitor $C_{ST}$ includes a portion of the gate line 13 as a first capacitor electrode and a metal pattern 30 as a second capacitor electrode. Since the metal pattern 30 is connected to the pixel electrode 17 through a contact hole, the storage capacitor $C_{ST}$ is electrically contacted to the pixel electrode 17. The metal pattern 30 may be made of the same material as the data line 15. When fabricating the LCD device 11 shown in FIG. 1, the upper substrate 5 is aligned with and attached to the lower substrate 22. In this process, the upper substrate 5 may be misaligned with the lower substrate 22 and light leakage may occur in the LCD device 11 due to an error margin in attaching the upper and lower substrate 5 and 22 together.

FIG. 2 is a cross-sectional view along the line II-II of FIG. 1 illustrating a pixel of the related art LCD device. As shown in FIG. 2, the related art LCD device includes the upper substrate 5, the lower substrate 22, and the liquid crystal layer 14. The upper and lower substrates 5 and 22 are spaced apart from each other, and the liquid crystal layer 14 is interposed therebetween.

A pixel region P, including a switching region S, and a storage region ST are defined on the lower substrate 22. A thin film transistor T is formed in the switching region S and includes a gate electrode 32, an active layer 34, a source electrode 36 and a drain electrode 38. A transparent pixel electrode 17 is formed in the pixel region P.

Referring to FIG. 1, the gate electrode 32 extends from the gate line 13 and the source electrode 36 extends from the data line 15. The gate, source, and drain electrodes 32, 36, and 38 are formed of a metallic material while the active layer 34 is formed of silicon. The pixel electrode 17 is formed of a transparent conducting material.

A storage capacitor $C_{ST}$ is formed in the storage region ST and includes a portion of a gate line 13 as a first capacitor electrode and a metal pattern 30 as a second electrode. The metal pattern 30 has an island shape and overlaps this portion of the gate line 13. The metal pattern 30 contacts the pixel electrode 17.

A passivation layer 40 is formed on the thin film transistor T and the storage capacitor $C_{ST}$.

In FIG. 2, the upper substrate 5 is spaced apart from the lower substrate 22. On an inner surface of the upper substrate 5, a black matrix 6 is disposed in the position corresponding to the thin film transistor T, the gate line 13 and the data line 15. The black matrix 6 is formed on the entire surface of the upper substrate 5 and has openings corresponding to the pixel electrode 17 of the lower substrate 11, as shown in FIG. 1. The black matrix 6 prevents light leakage in the LCD device except for the portion for the pixel electrode 17. The black matrix 6 protects the thin film transistor T from the light such that the black matrix 6 prevents the thin film transistor T from generating a photo current. The color filter layer including color filters 8a, 8b and 8c is formed on the inner surface of the upper substrate 5 to cover the black matrix 6. Each of color filters 8a, 8b and 8c has one of the red, green, and blue colors and corresponds to one pixel region P where the pixel electrode 17 is located. A common electrode 18 formed of a transparent conductive material is disposed on the color filter layer 8 over the upper substrate 5.

As stated above, the lower substrate 22 and the upper substrate 5 are fabricated respectively and then attached to each other.

In the related art LCD device, each pixel electrode 17 corresponds to each color filter. Furthermore, to prevent cross-talk between the pixel electrode 17 and the gate and data lines 13 and 15, the pixel electrode 17 is spaced apart from the data line 15 by a distance A and from the gate line 13 by a distance C, as shown in FIG. 2. The open areas A and C between the pixel electrode 17 and the data and gate lines 15 and 13 cause light leakage in the LCD device. Typically, light leakage primarily occurs in the open areas A and C. However, the black matrix 6 formed on the upper substrate 5 should cover the open areas A and C. However, when arranging the upper substrate 5 with the lower substrate 22 or vice versa, a misalignment may occur between the upper substrate 5 and the lower substrate 22. Therefore, the black matrix 6 is extended to be sure that the black matrix still covers the open areas A and C. That is, the black matrix 6 is designed to provide an alignment margin to prevent light leakage. However, by extending the black matrix, an aperture ratio of the liquid crystal display device is reduced in as much as the alignment margin of the black matrix 6 increases. Moreover, if there are errors in the alignment margin of the black matrix 6, light leakage occurs in the open areas A and C, thereby deteriorating the image quality of the LCD device.

To solve the above problems, a liquid crystal display device having a color filter on thin film transistor (COT) structure has been suggested.

FIG. 3 is a plan view of an array substrate for a liquid crystal display device having a COT structure according to the related art.

In FIG. 3, a plurality of gate lines 52 are formed along a first direction on a substrate. The gate lines 52 are parallel to and spaced apart from each other. A plurality of data lines 68 are formed along a second direction perpendicular to the first direction. The data lines 68 are parallel to and spaced apart from each other. The data lines 68 cross the gate lines 52 to define a plurality of pixel regions P.

A gate pad 56 is formed at one end of each gate line 52, and a transparent gate pad terminal 94 covers the gate pad 56. A data pad 70 is formed at one end of each data line 68, and a transparent data pad terminal 96 covers the data pad 70.

A thin film transistor T is formed at each crossing of the gate and data lines 52 and 68. The thin film transistor T includes a gate electrode 54, a semiconductor layer 60, a source electrode 64 and a drain electrode 66. An extending portion 62 extending from the semiconductor layer 60 may be further formed under the data line 68 in order to improve the contact of the data line 68.

Each color filter 78a, 78b and 78c of a color filter layer is formed in each pixel region P. A black matrix 76 corresponds to the thin film transistor T. Additionally, the black matrix 76 may further include portions corresponding to the gate line 52 and the data line 68.

A metal pattern 72 of an island shape is formed over the gate line 52. The gate line 52 and the metal pattern 72 constitute a storage capacitor $C_{ST}$. The gate line 52 functions as a first electrode of the storage capacitor $C_{ST}$, and the metal pattern 72 functions as a second electrode of the storage capacitor $C_{ST}$. The storage capacitor $C_{ST}$ may have various structures and positions.

A pixel electrode 92 is formed in each pixel region P. The pixel electrode 92 contacts the drain electrode 66 and the metal pattern 72.

In the above array substrate, since the color filter layer and the black matrix 76 are formed on the same substrate as the thin film transistor T and the pixel electrode 92, a portion as much as the alignment margin may be used for an aperture area to thereby increase an aperture ratio.

A manufacturing method of an array substrate for an LCD device having a COT structure according to the related art will be explained hereinafter with reference to attached drawings.

FIGS. 4A, 4B and 4C through FIGS. 8A, 8B and 8C illustrate a manufacturing method of an array substrate for an LCD device having a COT structure according to the related art.

FIGS. 4A, 4B and 4C illustrate a first mask process and a second mask process and correspond to cross-sections along the line IVA-IVA, IVB-IVB and IVC-IVC of FIG. 3, respectively.

In FIGS. 4A, 4B and 4C, a pixel region P, including a switching region S, a storage region ST, a gate pad region GP and a data pad region DP are defined on a substrate 50. A gate electrode 54 and a gate line 52 are formed on the substrate 50 by sequentially depositing and then patterning a metallic material through a first mask process. The gate electrode 54 corresponds to the switching region S, and a portion of the gate line 52 corresponds to the storage region ST. The gate line 52 has a gate pad 56 at one end thereof, and the gate pad 56 is disposed in the gate pad region GP. The metallic material includes aluminum (Al) or an aluminum alloy such as AlNd.

A gate insulating layer 58 is formed on a substantially entire surface of the substrate 50 including the gate electrode 54 and the gate line 52 thereon by depositing one or more selected from an inorganic insulating material group including silicon nitride ($SiN_x$) and silicon oxide ($SiO_2$).

A semiconductor layer 60 is formed on the gate insulating layer 58 over the gate electrode 54 by sequentially depositing and then patterning an intrinsic amorphous silicon layer and an impurity-doped amorphous silicon layer through a second mask process. The semiconductor layer 60 includes an active layer 60a of intrinsic amorphous silicon and an ohmic contact layer 60b of impurity-doped amorphous silicon. An extending portion 62 perpendicularly extending from the semiconductor layer 60 is also formed on the gate insulating layer 58. The extending portion 62 may be omitted.

FIGS. 5A, 5B and 5C illustrate a third mask process and correspond to cross-sections along the line IVA-IVA, IVB-IVB and IVC-IVC of FIG. 3, respectively.

In FIGS. 5A, 5B and 5C, a metallic material is deposited on the entire surface of the substrate 50 including the active layer 60a and the ohmic contact layer 60b thereon and then is patterned through a third mask process to form a source electrode 64, a drain electrode 66 and a data line 68. The source and drain electrodes 64 and 66 are spaced apart and are over the ohmic contact layer 60b. The data line 68 is connected to the source electrode 64. A data pad 70 is formed at one end of the data line 68 and is disposed in the data pad region DP. A metal pattern 72 of an island shape is formed over the gate line 52 in the storage region ST simultaneously with the source and drain electrodes 64 and 66.

Next, the ohmic contact layer 60b exposed between the source and drain electrodes 64 and 66 is removed, thereby exposing the active layer 60a.

FIGS. 6A, 6B and 6C illustrate a fourth mask process and a fifth mask process and correspond to cross-sections along the line IVA-IVA, IVB-IVB and IVC-IVC of FIG. 3, respectively.

In FIGS. 6A, 6B and 6C, a passivation layer 74 is formed on the entire surface of the substrate 50 including the source and drain electrodes 64 and 66 and the data line 68 thereon by depositing one selected from an inorganic insulating material group including silicon nitride ($SiN_x$) and silicon oxide ($SiO_2$).

A black matrix 76 is formed on the passivation layer 74 by sequentially coating and then patterning black resin through a fourth mask process. The black matrix 76 corresponds to the source and drain electrodes 64 and 66 and the exposed active layer 60a. The black matrix 76 may further include portions corresponding to the gate line 52 and the data line 68.

Next, a color filter layer, for example a green color filter 78b, is formed on the passivation layer 74 in the pixel region P by sequentially coating and then patterning color resin through a fifth mask process. Although not shown in the drawings, red and blue color filters are formed through the same process as the green color filter 78b.

FIGS. 7A, 7B and 7C illustrate a sixth mask process and correspond to cross-sections along the line IVA-IVA, IVB-IVB and IVC-IVC of FIG. 3, respectively.

In FIGS. 7A, 7B and 7C, a planarization layer 80 is formed on the entire surface of the substrate 50 including the color filter layer 78b by coating one of benzocyclobutene (BCB) and acrylic resin. The planarization layer 80 is patterned through a sixth mask process to thereby form a drain contact hole 82, a storage contact hole 84, a gate pad contact hole 86 and a data pad contact hole 88. The drain contact hole 82 exposes the drain electrode 66; the storage contact hole 84 exposes the metal pattern 72; the gate pad contact hole 86 exposes the gate pad 56; and the data pad contact hole 88 exposes the data pad 70.

FIGS. 8A, 8B and 8C illustrate a seventh mask process and correspond to cross-sections along the line IVA-IVA, IVB-IVB and IVC-IVC of FIG. 3, respectively.

In FIGS. 8A, 8B and 8C, a pixel electrode 92, a gate pad terminal 94 and a data pad terminal 96 are formed on the substrate 50 including the planarization layer 80 thereon by sequentially depositing and then patterning one selected from a transparent conductive material group including indium tin oxide (ITO) and indium zinc oxide (IZO) through a seventh mask process. The pixel electrode 92 contacts the drain electrode 66, and the metal pattern 72 and is disposed in the pixel region P. The gate pad terminal 94 contacts the gate pad 56, and the data pad terminal 96 contacts the data pad 70.

Therefore, the array substrate for the liquid crystal display device of the related art may be fabricated through seven-mask processes.

However, since each of the mask processes includes several steps of cleaning, coating a photo-resist layer, exposing through a mask, developing the photoresist layer, and etching, the entire processes are very complicated and expensive. Therefore, how to reduce fabricating time and costs by simplifying the processes is an important issue to be resolved.

SUMMARY OF THE INVENTION

Accordingly, the present invention is directed to a liquid crystal display (LCD) device having a color filter layer on an array substrate and a manufacturing method thereof that substantially obviates one or more of the problems due to limitations and disadvantages of the related art.

An object of the present invention is to provide a liquid crystal display device that has a high aperture ratio.

Another object of the present invention is to provide a method of manufacturing a liquid crystal display device that reduces manufacturing costs and time and simplifies the processes.

To achieve these and other advantages and in accordance with the purpose of the present invention, as embodied and broadly described a method of manufacturing a liquid crystal display device includes forming a gate line and a gate electrode on a substrate through a first mask process, forming a gate insulating layer on substantially an entire surface of the substrate including the gate line and the gate electrode, forming an active layer, an ohmic contact layer, a source electrode, a drain electrode and a data line on the gate insulating layer through a second mask process by using a single mask, the data line crossing the gate line to define a pixel region, forming a first passivation layer on substantially an entire surface of the substrate including the source and drain electrodes and the data line, forming a black matrix on the first passivation layer over the active layer through a third mask process, forming a color filter layer on the first passivation layer in the pixel region through a fourth mask process, forming a second passivation layer on substantially an entire surface of the substrate including the black matrix and the color filter layer, forming a photoresist pattern to expose the second passivation layer corresponding to the pixel region and a portion of the drain electrode through a fifth mask process, removing the exposed second passivation layer and removing a portion of the first passivation layer contacting the second passivation layer to thereby expose the portion of the drain electrode, forming a transparent conductive layer on substantially an entire surface of the substrate including the exposed portion of the drain electrode, and forming a pixel electrode in the pixel region by removing the photoresist pattern and the transparent conductive layer on the photoresist pattern, the pixel electrode contacting the exposed portion of the drain electrode.

In another aspect, a liquid crystal display device includes a substrate, a gate line and a gate electrode on the substrate, a gate insulating layer on the gate line and the gate electrode, an active layer on the gate insulating layer over the gate electrode, an ohmic contact layer on the active layer, a source electrode, a drain electrode and a data line on the ohmic contact layer, the data line crossing the gate line to define a pixel region, a first passivation layer on the source and drain electrodes and the data line, a black matrix on the first passivation layer over the active layer, a color filter layer on the first passivation layer in the pixel region, a second passivation layer on the black matrix and the color filter layer, the second passivation layer exposing the color filter layer in the pixel region, and a pixel electrode on the exposed color filter layer in the pixel region, the pixel electrode connected to the drain electrode.

In another aspect, a liquid crystal display device includes a lower substrate, a thin film transistor adjacent to a pixel region, the thin film transistor including a gate electrode on the substrate, a source electrode, the source electrode having a first end and a second end, a drain electrode, the drain electrode having a first end and a second end, the second end of the drain electrode facing the first end of the source electrode, and an active layer, the active layer being above the gate electrode and below the source and drain electrodes, the active layer extending beyond the first end of the source electrode and the second end of the drain electrode, a color filter layer in the pixel region, a pixel electrode above the color filter layer, the pixel electrode connected to the drain electrode, an upper substrate above the color filter layer, and a liquid crystal layer between the lower substrate and the upper substrate.

In another aspect, a method of fabricating a liquid crystal display device includes the steps of forming a thin film transistor, the steps of forming the thin film transistor including forming a gate electrode on a substrate, forming a gate insulating layer on the gate electrode and the substrate, forming a source electrode, a drain electrode, and an active layer on the gate insulating layer by using a single mask, forming a black matrix above the thin film transistor, forming a color filter layer in a pixel region, and forming a pixel electrode above the color filter layer.

In another aspect, a method of fabricating a liquid crystal display device includes the steps of forming a thin film transistor including a source electrode and a drain electrode on a substrate, forming a first passivation layer on the substrate, forming a black matrix on the first passivation layer, forming a color filter layer on the first passivation layer in a pixel region, and forming a pixel electrode above the color filter layer and the black matrix by using a single mask.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIGS. 4A, 4B and 4C through FIGS. 8A, 8B and 8C show cross-sectional views illustrating a manufacturing method of an array substrate for an LCD device having a COT structure according to the related art.

FIGS. 9A, 9B and 9C through FIGS. 21A, 21B and 21C show cross-sectional views illustrating a method of manufacturing an array substrate for a liquid crystal display device having a color filter on thin film transistor structure according to an embodiment of the present invention.

DETAILED DESCRIPTION OF THE PREFERRED EMBODIMENTS

Reference will now be made in detail to the preferred embodiments of the present invention, examples of which are illustrated in the accompanying drawings.

FIGS. 9A, 9B and 9C through FIGS. 21A, 21B and 21C illustrate a method of manufacturing an array substrate for a liquid crystal display (LCD) device having a color filter on thin film transistor (COT) structure according to an embodiment of the present invention.

Figure 1:
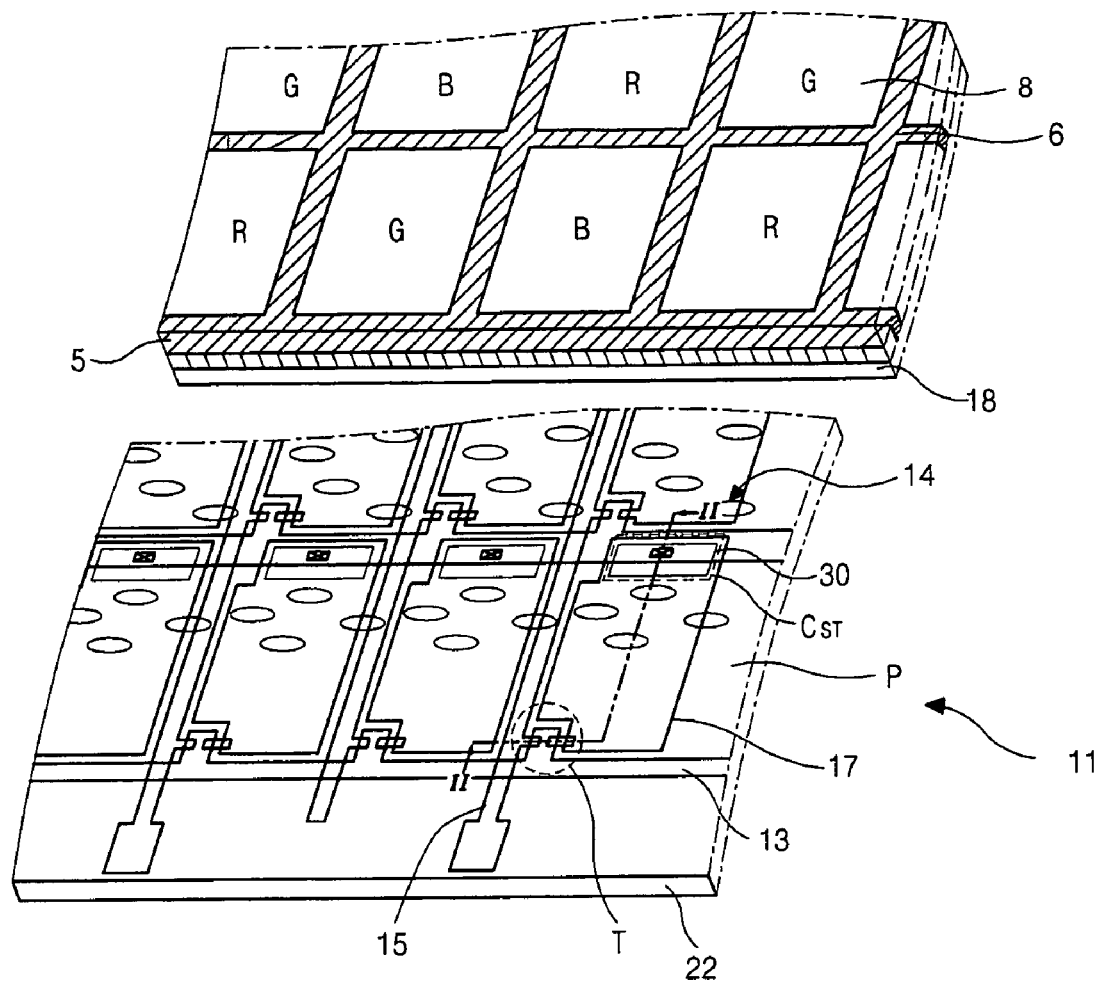
FIG. 1 is an expanded perspective view illustrating a related art liquid crystal device.
Figure 2:
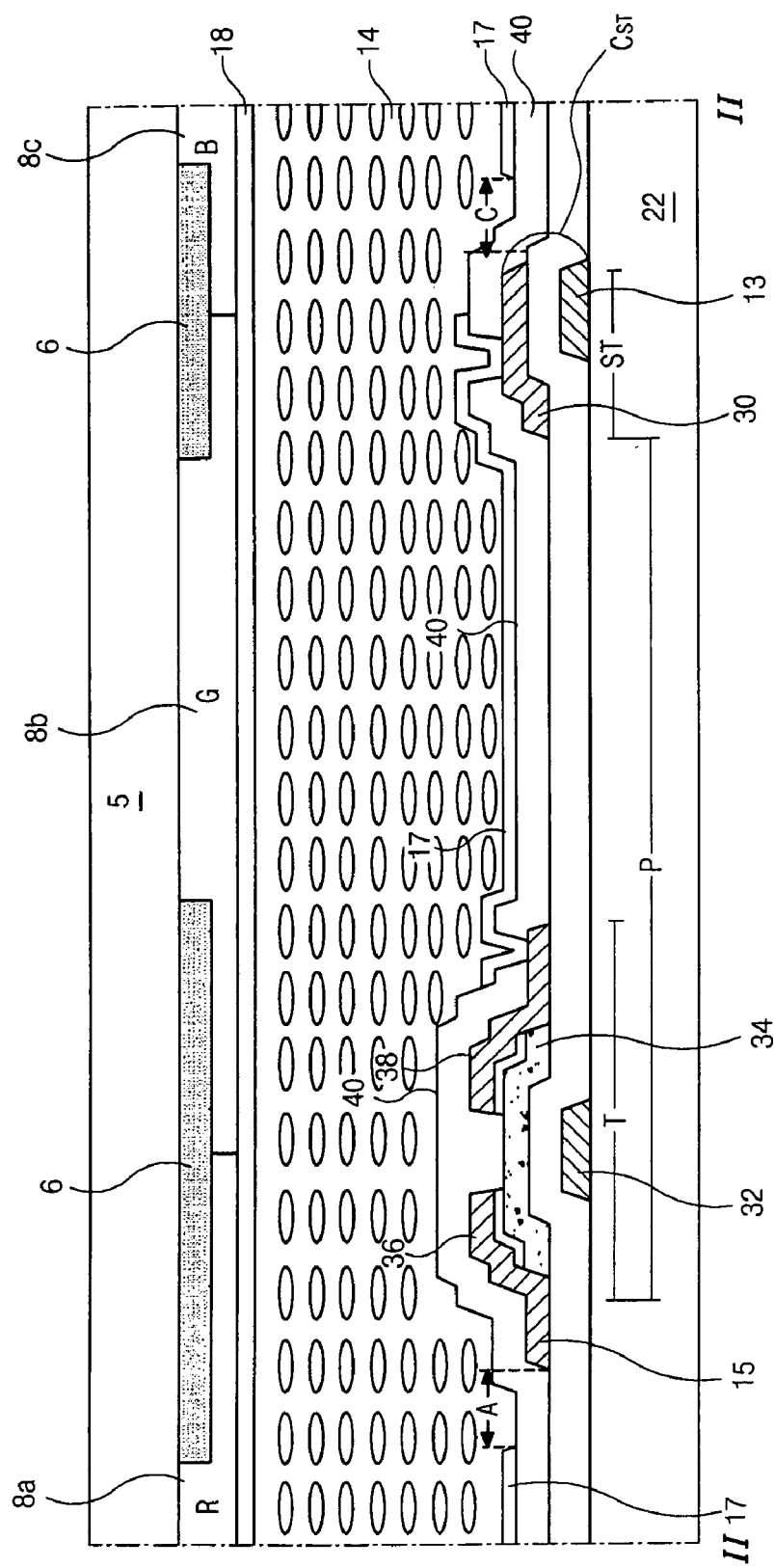
FIG. 2 is a cross-sectional view along the line II-II of FIG. 1 illustrating a pixel of the related art liquid crystal display device.
Figure 3:
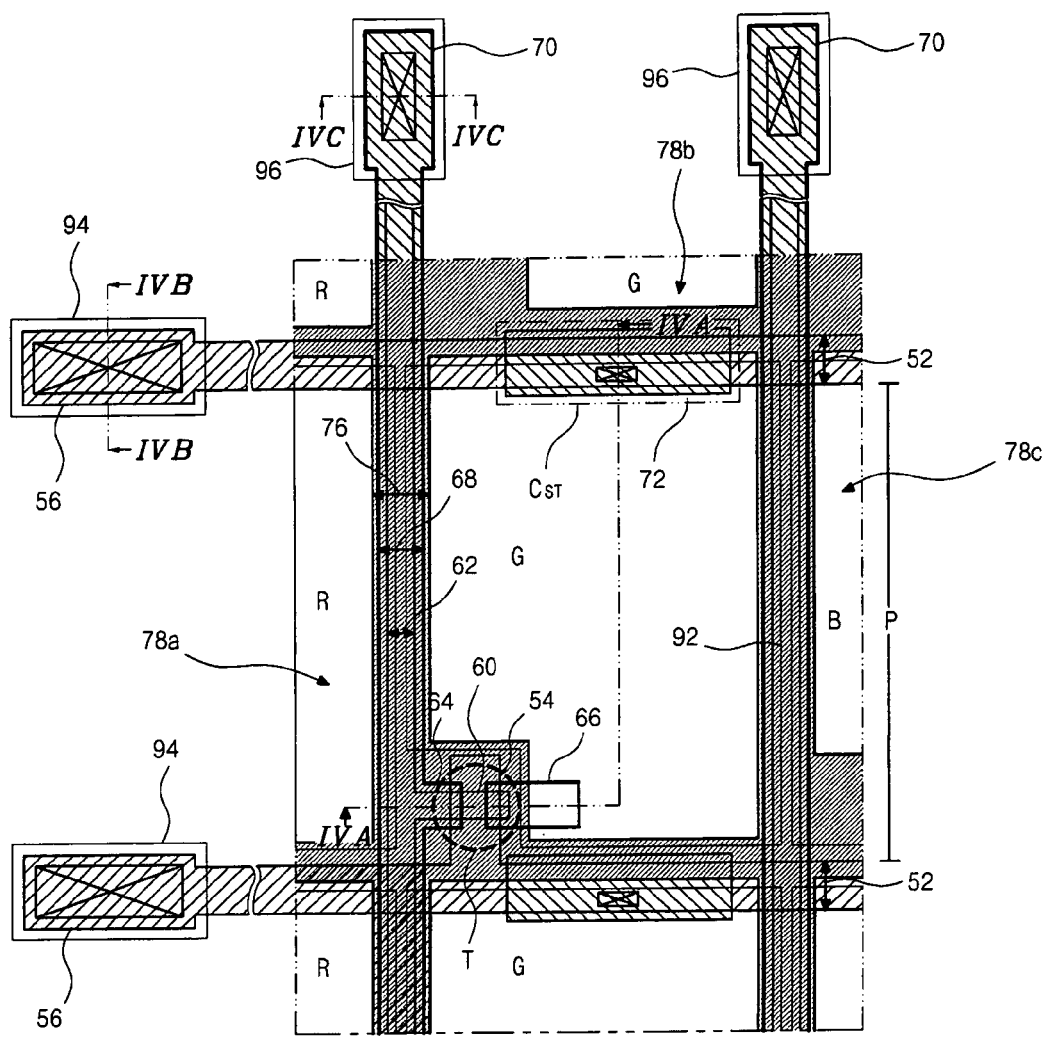
FIG. 3 is a plan view of an array substrate for a liquid crystal display (LCD) device having a color filter on thin film transistor (COT) structure according to the related art.
Figure 4A:
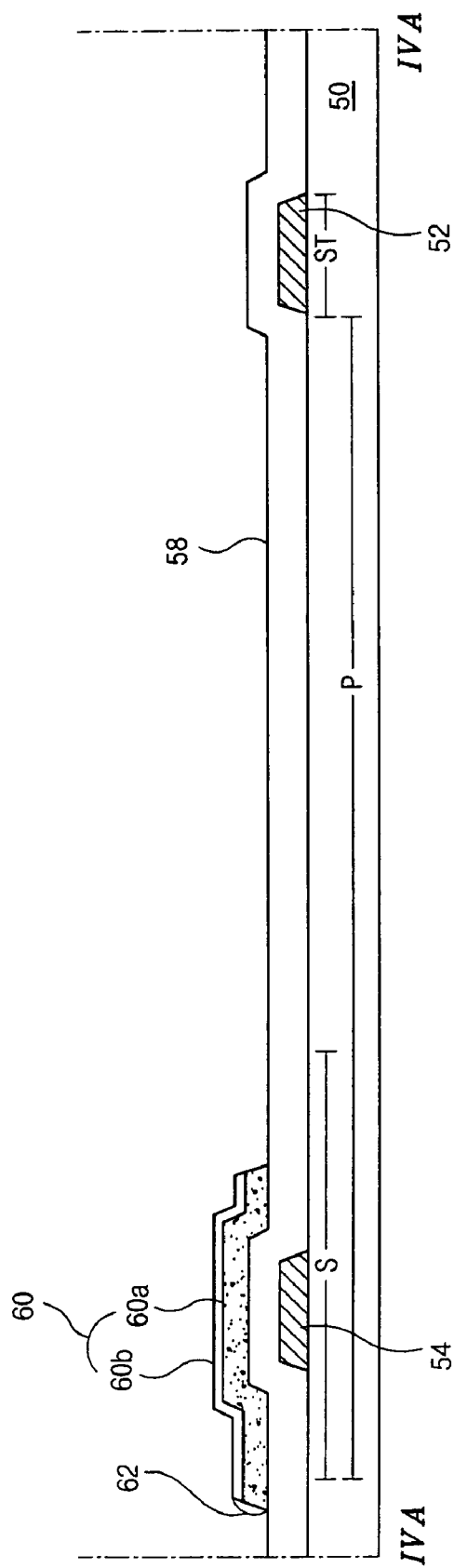
Figure 4B:
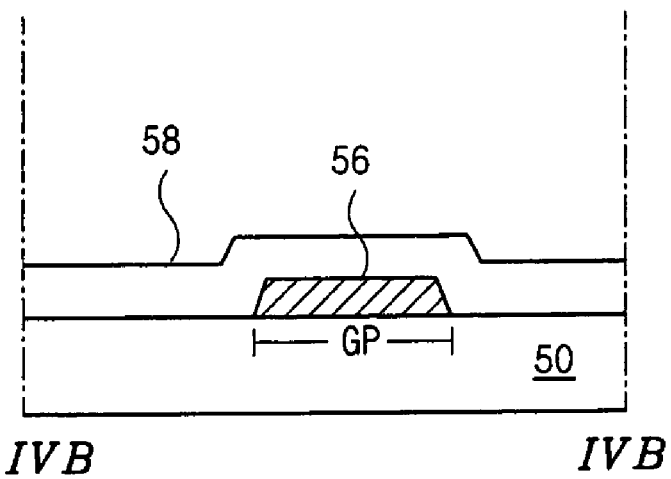
Figure 4C:
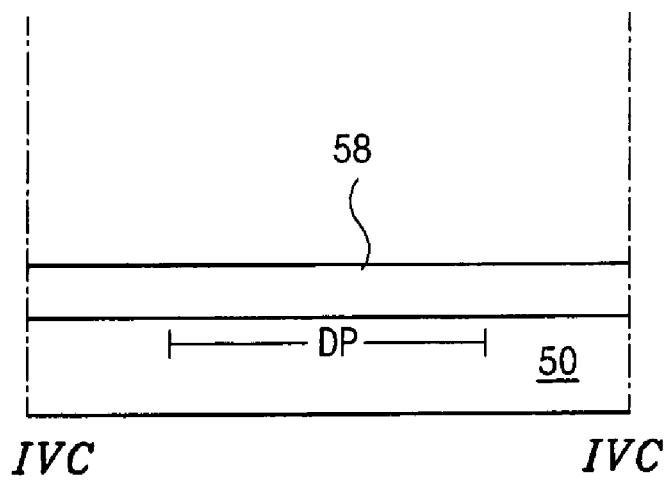
Figure 5A:
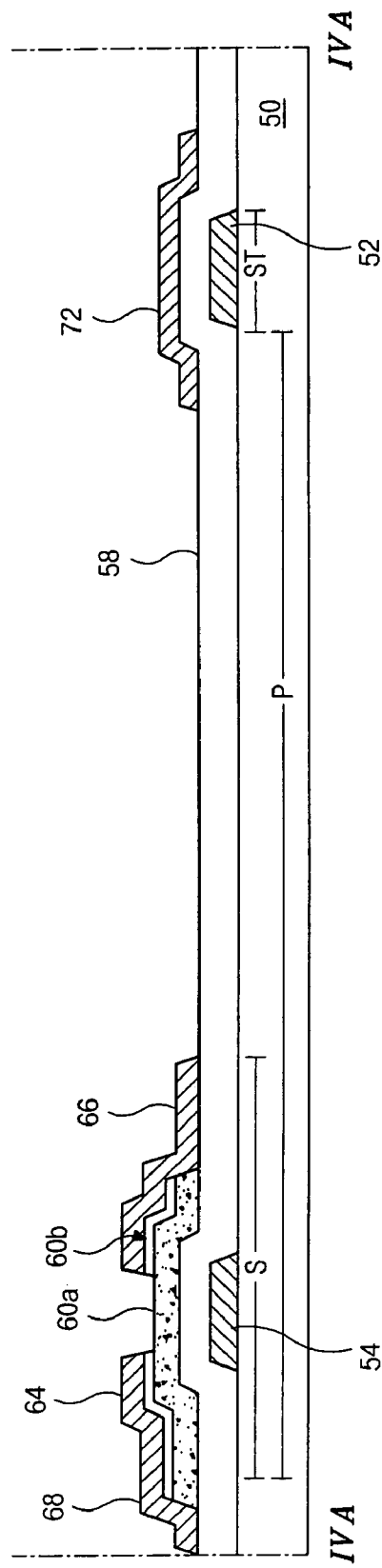
Figure 5B:
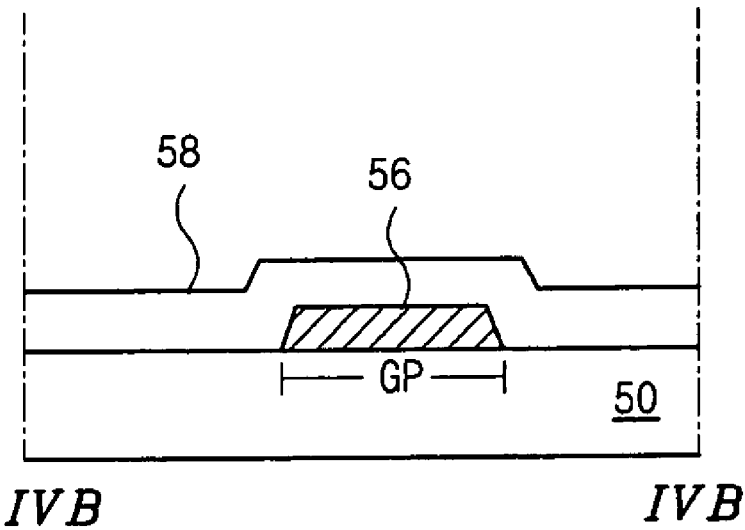
Figure 5C:
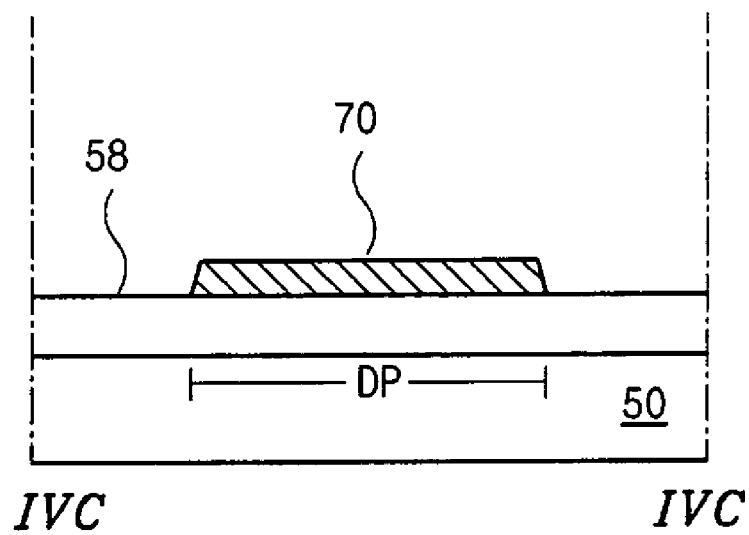
Figure 6A:
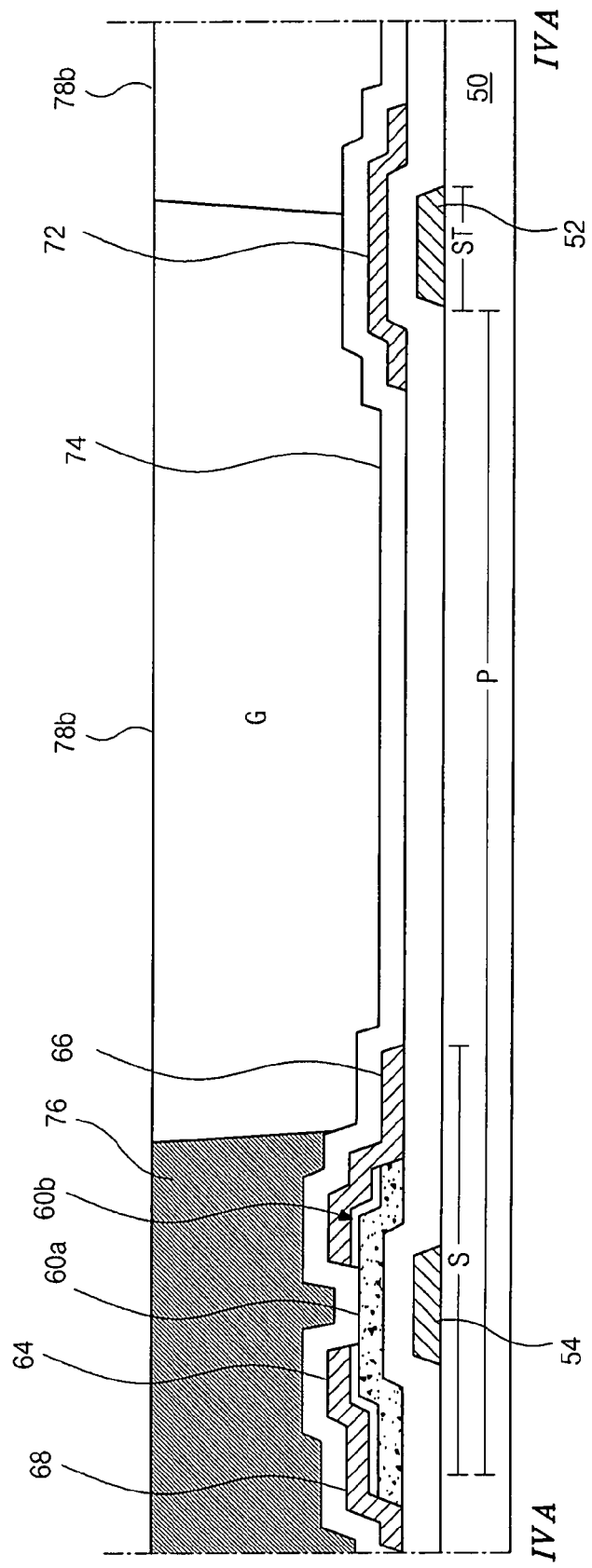
Figure 6B:
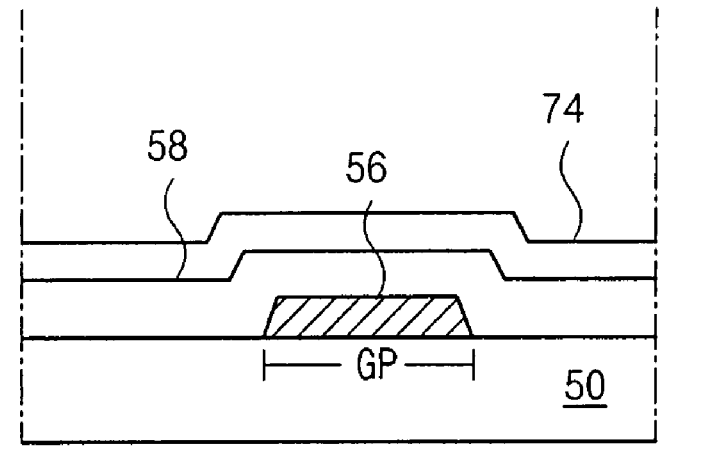
Figure 6C:
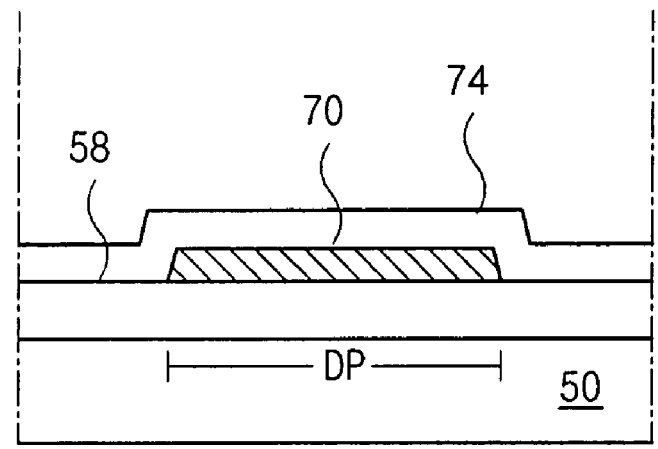
Figure 7A:
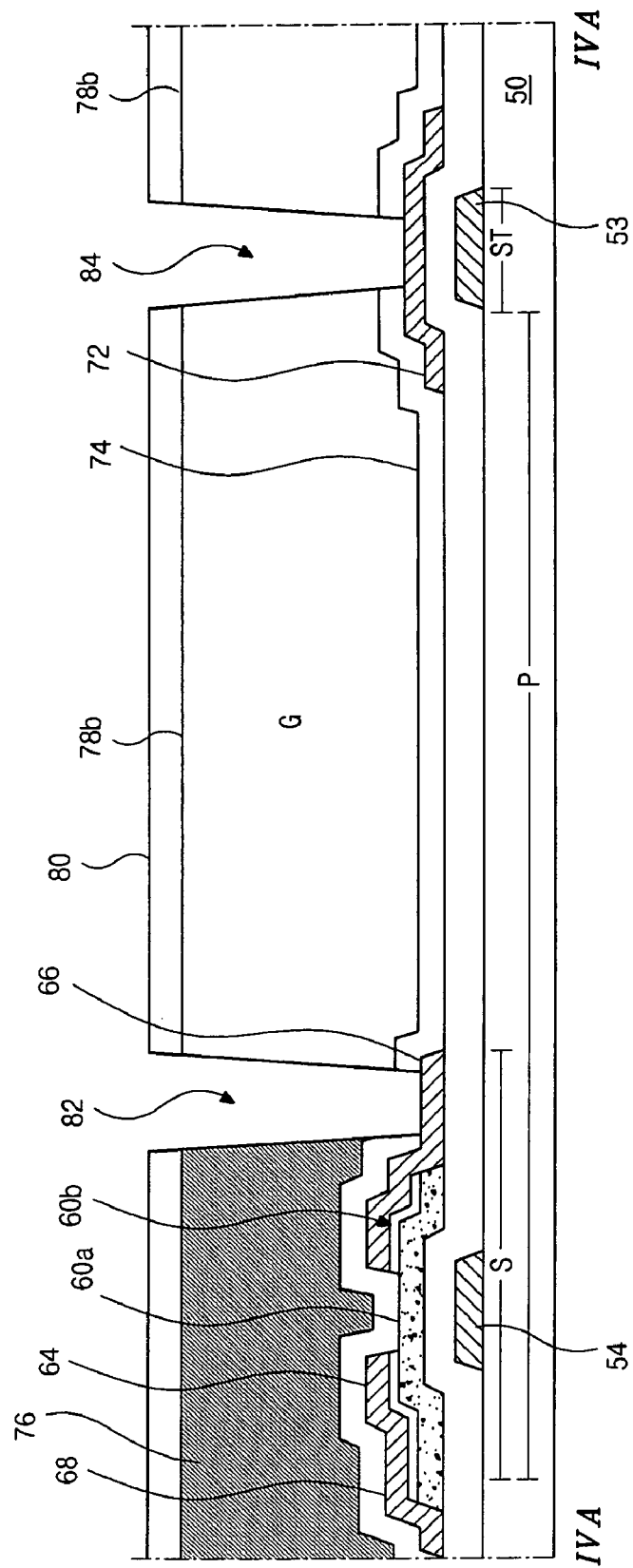
Figure 7B:
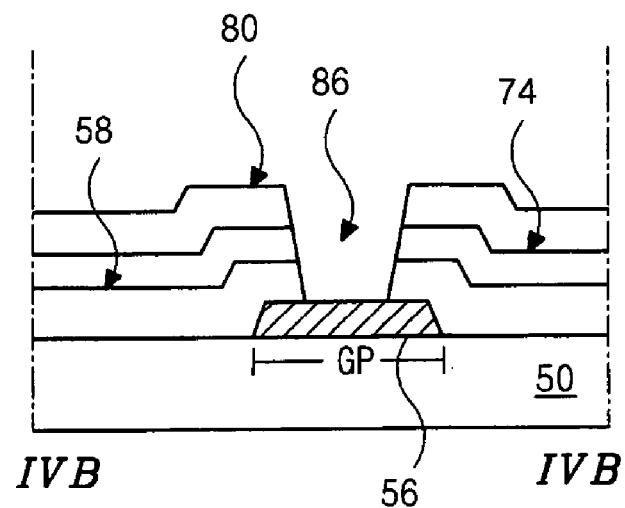
Figure 7C:
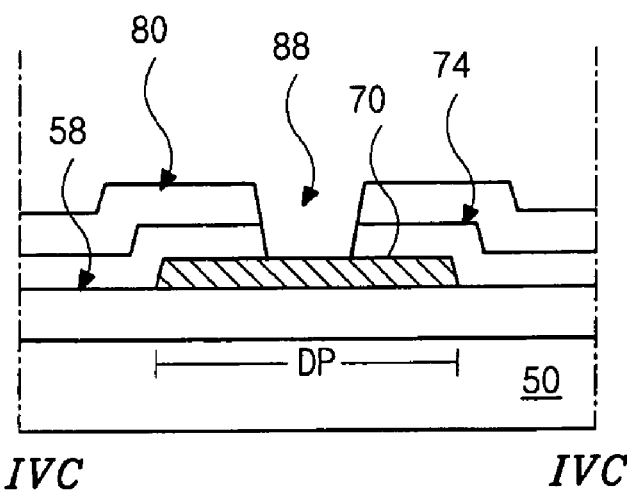
Figure 8A:
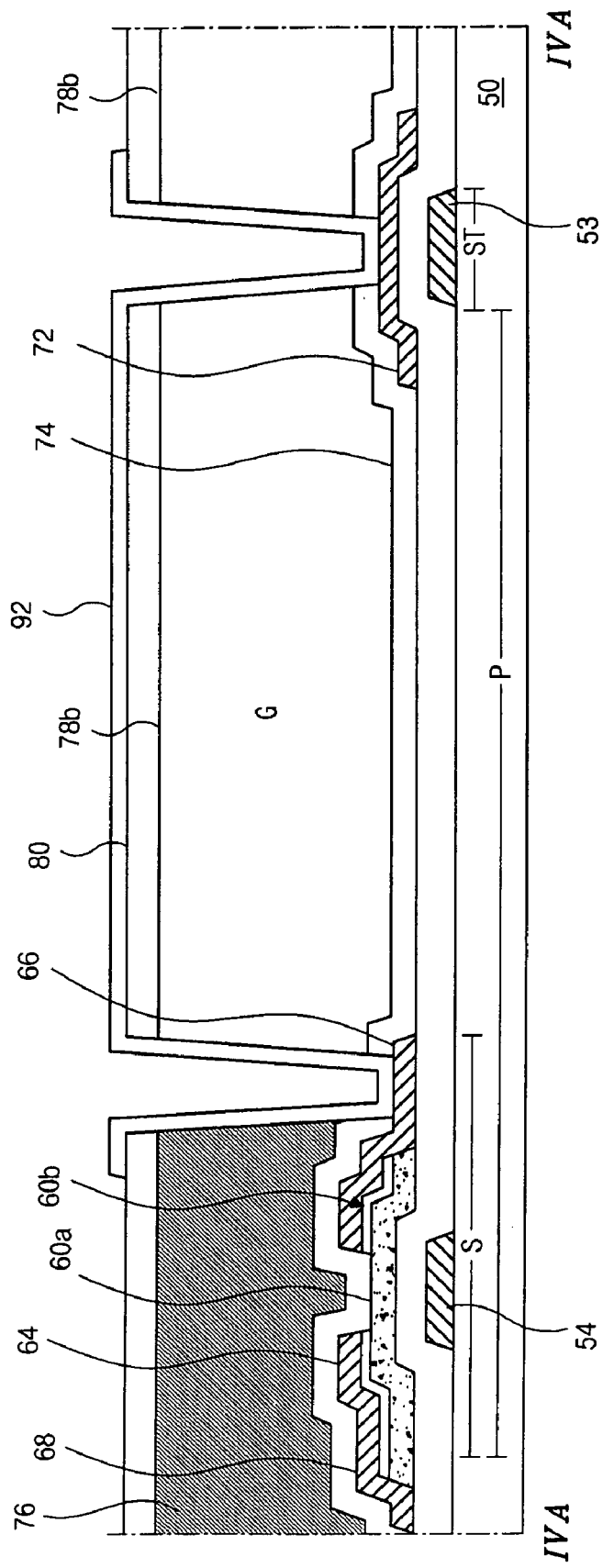
Figure 8B:
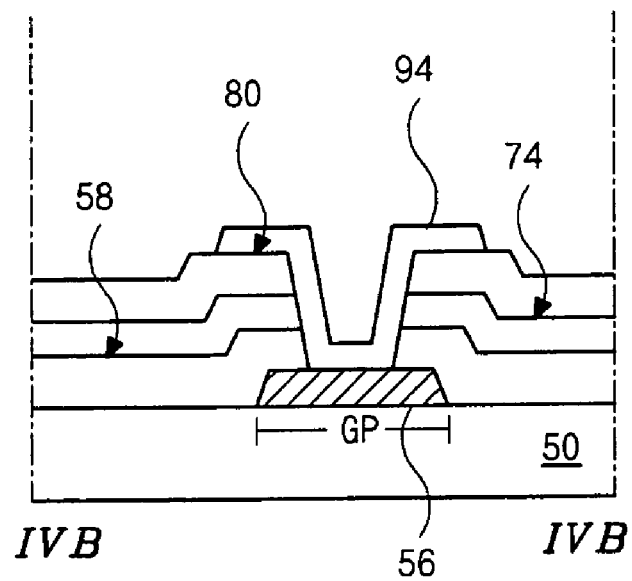
Figure 8C:
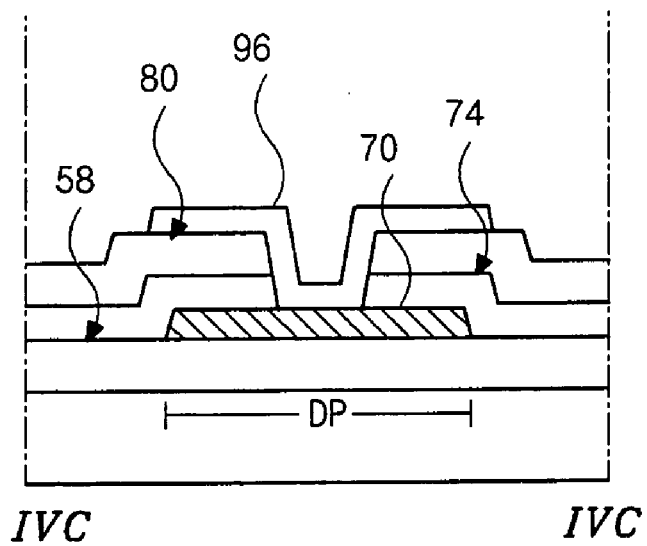
Figure 9A:
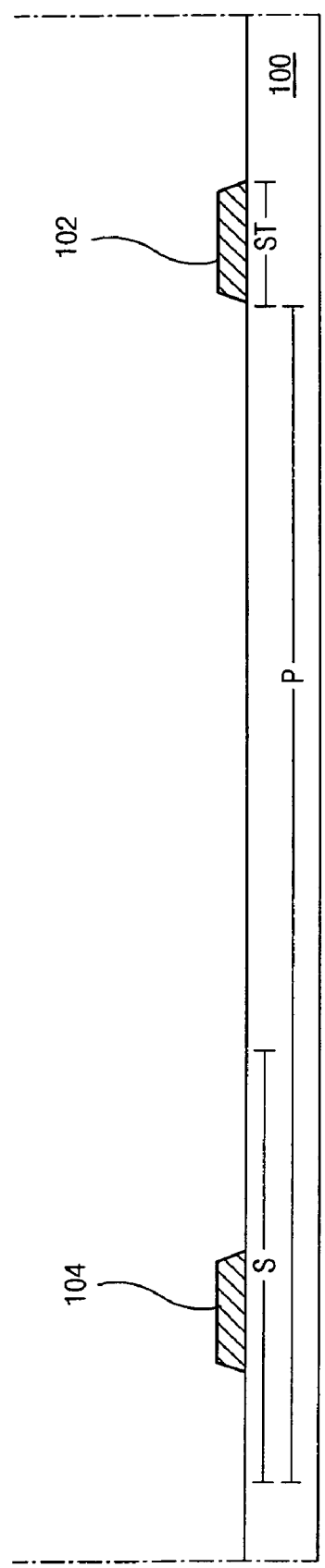
Figure 9B:
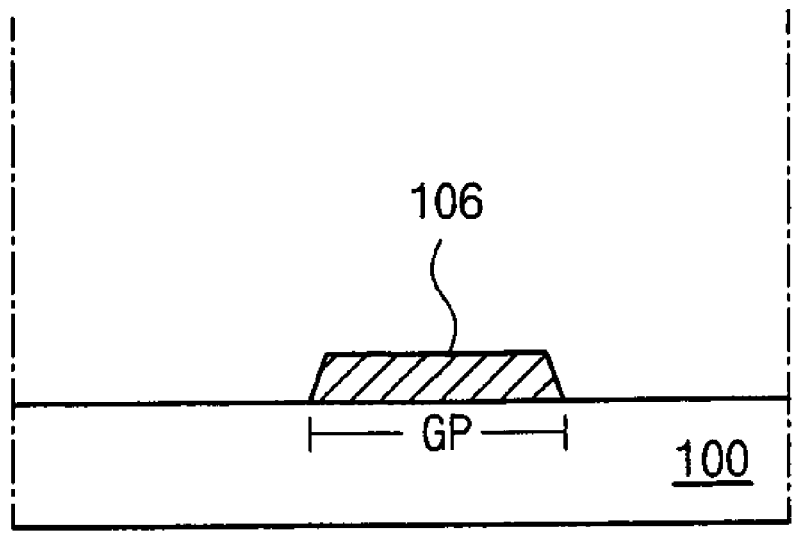
Figure 9C:
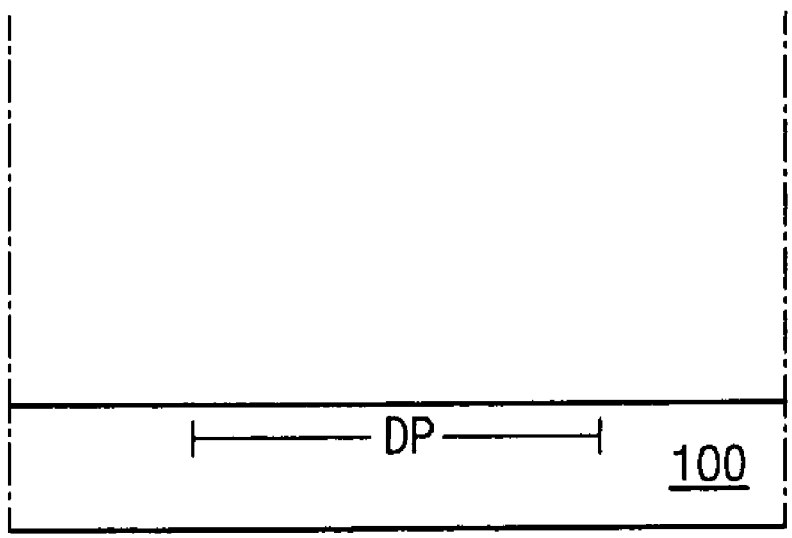

FIGS. 9A, 9B and 9C illustrate a first mask process and show cross-sectional views corresponding to a pixel region, a gate pad region and a data pad region, respectively.

In FIGS. 9A, 9B and 9C, a pixel region P, including a switching region S, a storage region ST, a gate pad region GP and a data pad region DP are defined on a substrate 100.

A gate line 102 and a gate electrode 104 are formed on the substrate 100 by sequentially depositing and then patterning one or more material selected from a metallic material group through a first mask process. The metallic material group includes aluminum (Al), an aluminum alloy (AlNd), copper (Cu), tungsten (W), chromium (Cr) and molybdenum (Mo). The gate electrode 104 corresponds to the switching region S, and a portion of the gate line 102 corresponds to the storage region ST. The gate electrode 104 is connected to the gate line 102. The gate line 102 has a gate pad 106 at one end thereof, and the gate pad 106 is disposed in the gate pad region GP.

FIGS. 10A, 10B and 10C through FIGS. 14A, 14B and 14C illustrate a second mask process and show cross-sectional views corresponding to the pixel region, the gate pad region and the data pad region, respectively.

Figure 10A:
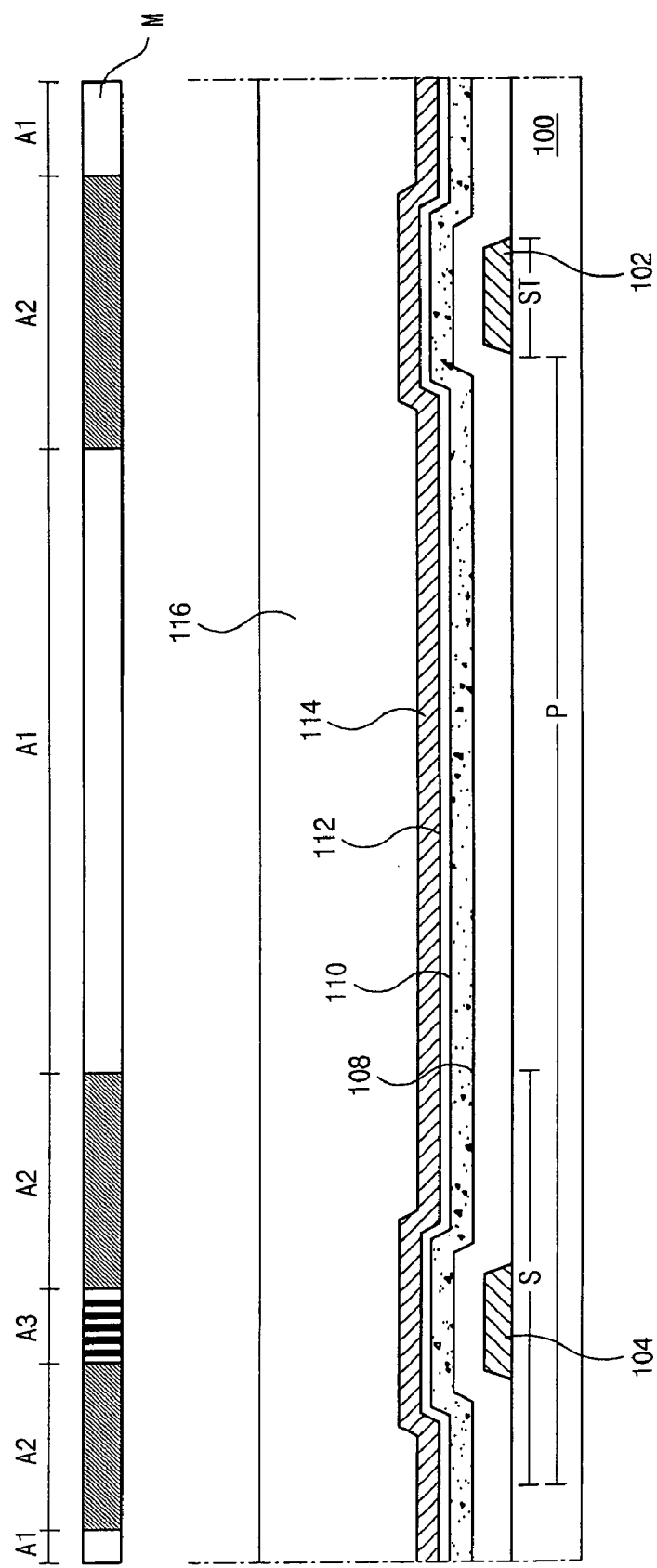
Figure 10B:
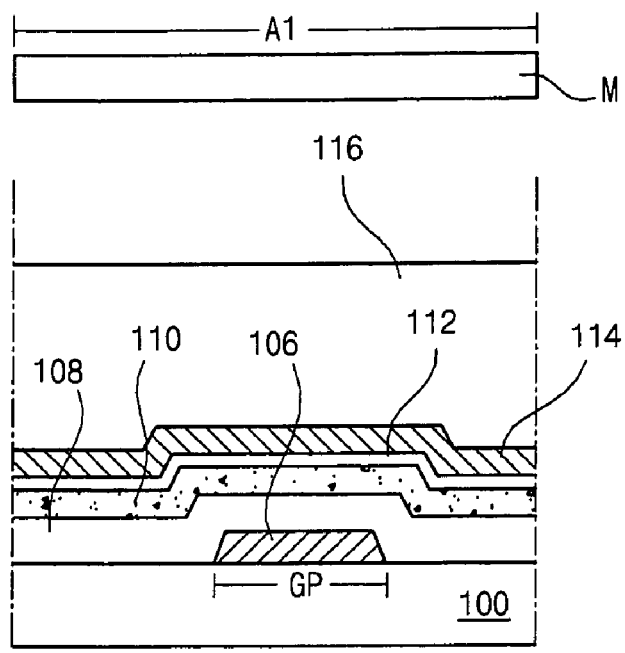
Figure 10C:
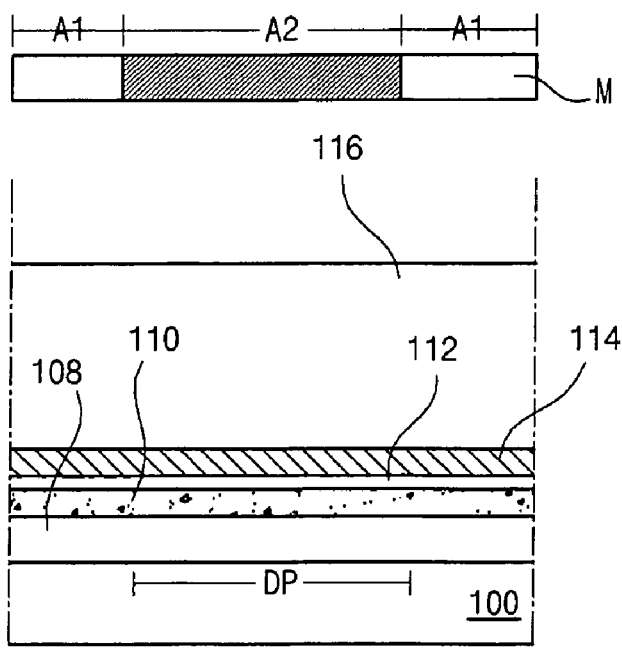

In FIGS. 10A, 10B and 10C, a gate insulating layer 108 is formed on the entire surface of the substrate 100 including the gate electrode 104, the gate line 102 and the gate pad 106 thereon by depositing one or more selected from an inorganic insulating material group including silicon nitride ($SiN_x$) and silicon oxide ($SiO_2$).

Next, an semiconductor layer such as an intrinsic amorphous silicon layer 110 and an ohmic contact layer such as an impurity-doped amorphous silicon layer 112 are formed on the entire surface of the substrate 100 including the gate insulating layer 108 thereon by sequentially depositing intrinsic amorphous silicon (a-Si:H) and impurity-doped amorphous silicon (n+ or p+ a-Si:H). A metal layer 114 is formed on the impurity-doped amorphous silicon layer 112 by depositing one of metallic materials stated above.

A mask layer such as a photoresist layer 116 is formed on the entire surface of the substrate 100 including the metal layer 114 thereon by coating photoresist. A mask M is disposed over the photoresist layer 116. The mask M includes a transmitting portion A1, a blocking portion A2 and a partial (e.g., half) transmitting portion A3. The blocking portion A2 corresponds to the switching region S, the storage region ST and the data pad region DP, and the partial transmitting portion A3 corresponds to a center portion of the gate electrode 104 in the switching region S. The transmitting portion A1 corresponds to the other regions.

The photoresist layer 116 may be a positive type, and thus a portion exposed to light is developed and removed. Subsequently, the photoresist layer 116 is exposed to light, and the photoresist layer 116 corresponding to the partial transmitting portion A3 is exposed less than the photoresist layer 116 corresponding to the transmitting portion A1 of the mask M. A negative type photoresist can also apply to this embodiment with a mask M' having a blocking portion A1', a transmitting portion A2' and a partial transmitting portion A3'.

Figure 11A:
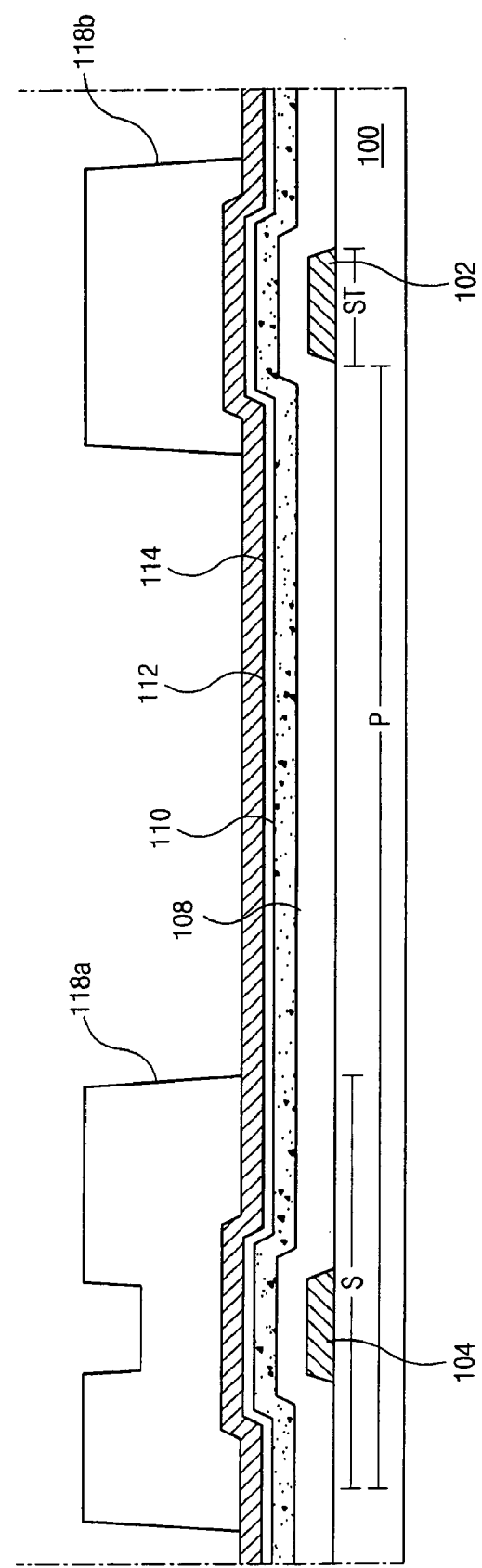
Figure 11B:
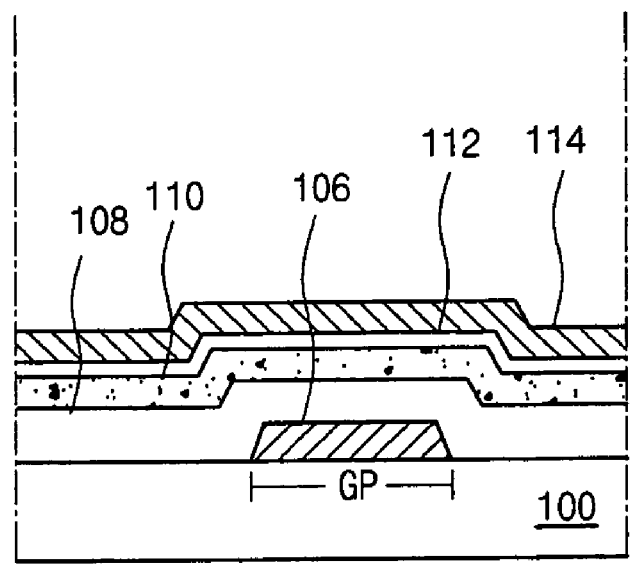
Figure 11C:
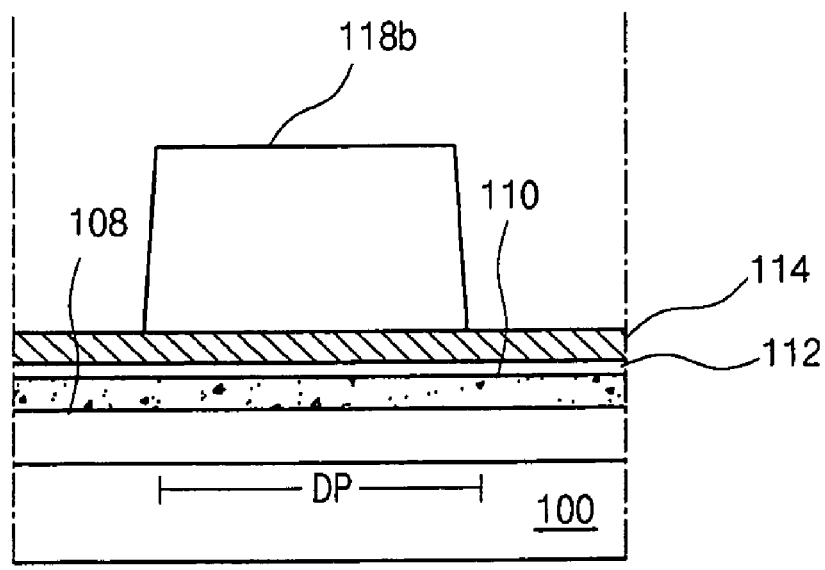

As illustrated in FIGS. 11A, 11B and 11C, the photoresist layer 116 of FIGS. 10A, 10B and 10C is developed, and a first photoresist pattern 118a and a second photoresist pattern 118b are formed. The first photoresist pattern 118a corresponds to the switching region S and has portions of different thicknesses. The second photoresist pattern 118b corresponds to the storage region ST and the data pad region DP. The first photoresist pattern 118a with a first thickness corresponds to the blocking portion A2 of FIG. 10A, and the first photoresist pattern 118a with a second thickness, which is thinner than the first thickness, corresponds to the partial transmitting portion A3 of FIG. 10A. Therefore, the first photoresist pattern 118a with the second thickness is a recess corresponding to the partial transmitting portion A3. The second photoresist pattern 118b has the same thickness as the first photoresist pattern 118a with the first thickness. The second photoresist pattern 118b in the data pad region DP extends from the first photoresist pattern 118a along a direction perpendicular to the gate line 102.

Figure 12A:
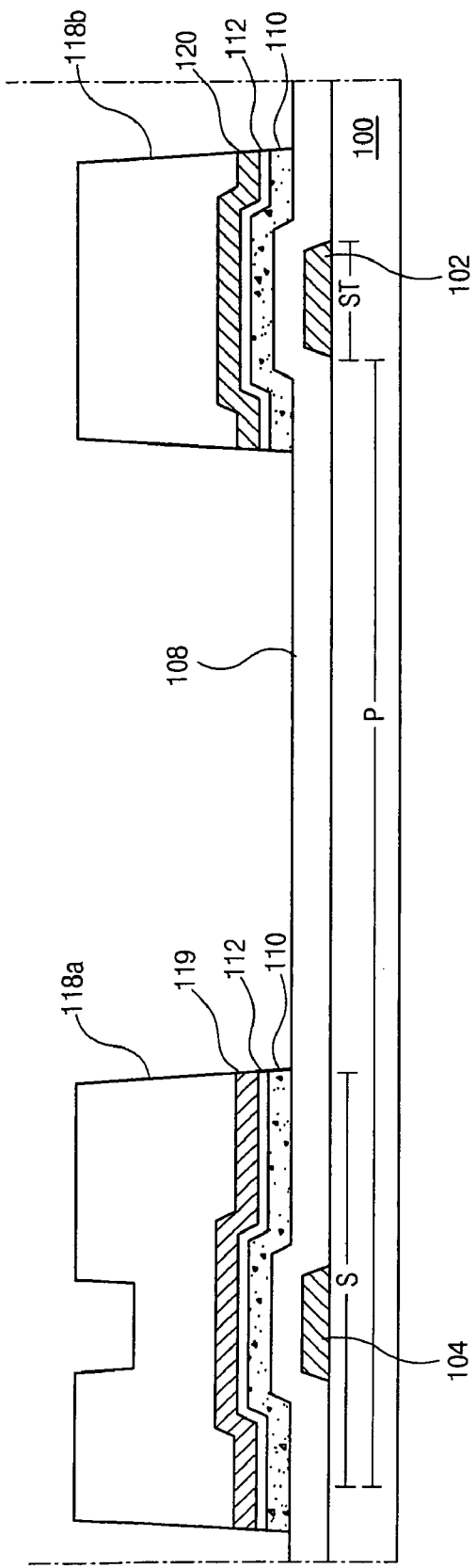
Figure 12B:
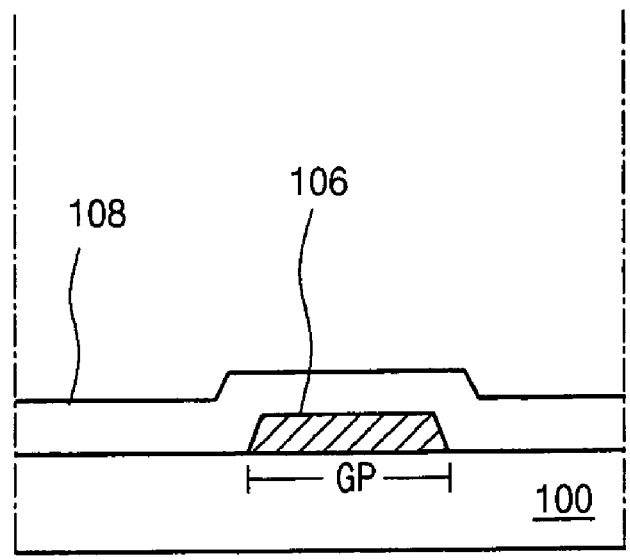
Figure 12C:
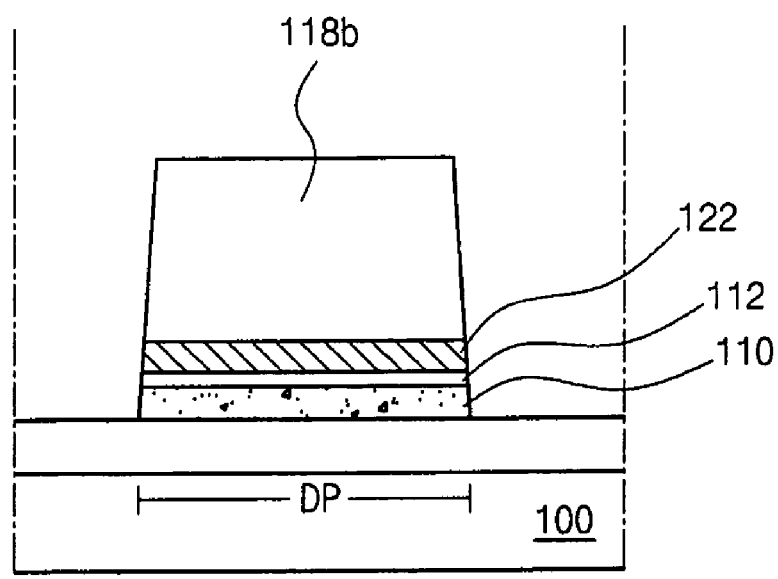

As illustrated in FIGS. 12A, 12B and 12C, the metal layer 114, the impurity-doped amorphous silicon layer 112 and the intrinsic amorphous silicon layer 110 of FIGS. 11A, 11B and 11C exposed by the first and second photoresist patterns 118a and 118b are removed. Thus, a source and drain pattern 119, a metal pattern 120 of an island shape, and a data pad 122 are formed under the first photoresist pattern 118a in the switching region S, under the second photoresist pattern 118b in the storage region ST, and under the second photoresist pattern 118b in the data pad region DP, respectively. At this time, a data line (not shown) is also formed. The data line is connected to the source and drain pattern 119 and has the data pad 122 at one end thereof. The impurity-doped amorphous silicon layer 112 and the intrinsic amorphous silicon layer 110 are patterned and have the same shape as the source and drain pattern 119, the metal pattern 120 and the data pad 122.

Next, as illustrated in 13A, 13B and 13C, the first photoresist pattern 118a of FIG. 12A is partially removed through an ashing process, and thus the source and drain pattern 119 below the recess is exposed. Here, the other portion of the first photoresist pattern 118a and the second photoresist pattern 118b are also removed partially through the ashing process, and the photoresist pattern 118a with the first thickness and the second photoresist pattern 118b are thinned. Additionally, edges of the first and second photoresist patterns 118a are removed, and peripheral portions F of the source and drain pattern 119, of the metal pattern 120 and of the data pad 122 are exposed.

Figure 13A:
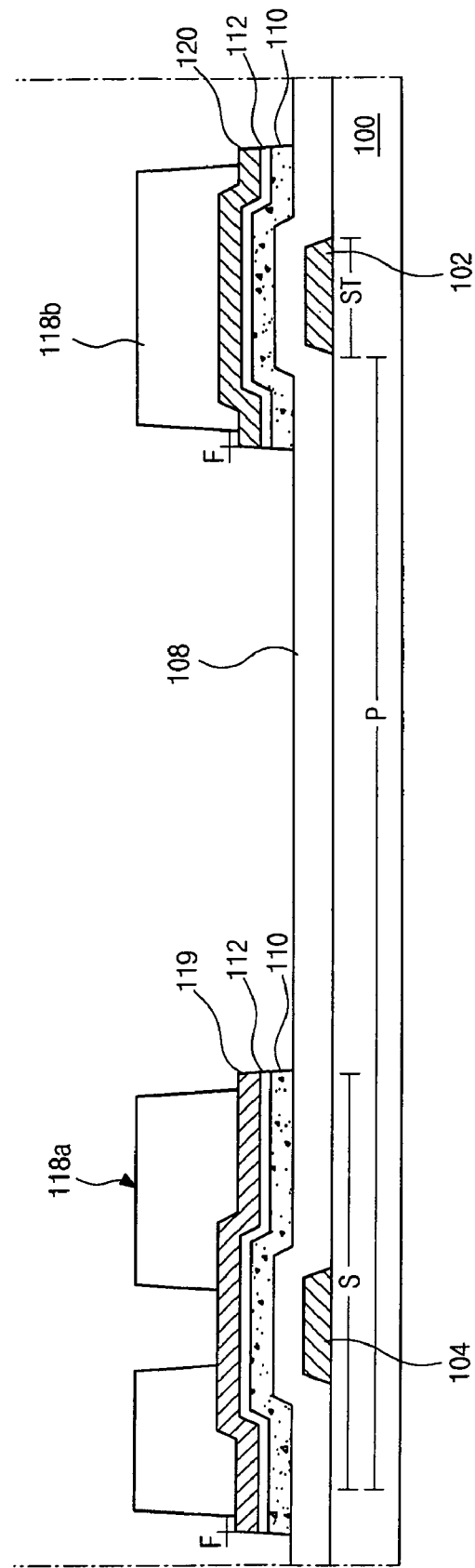
Figure 13B:
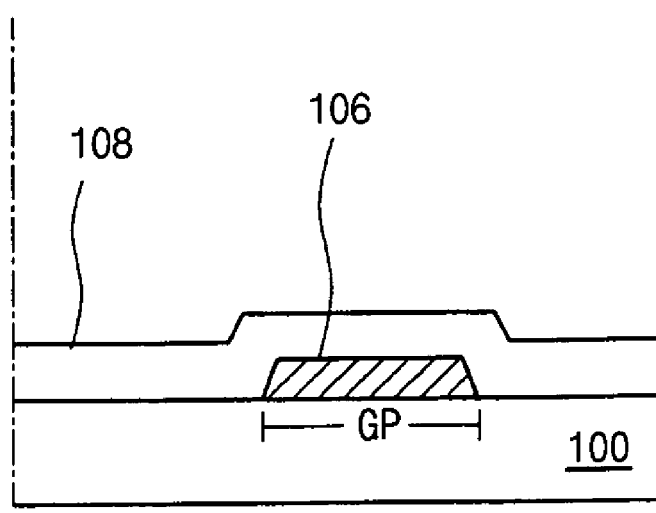
Figure 14A:
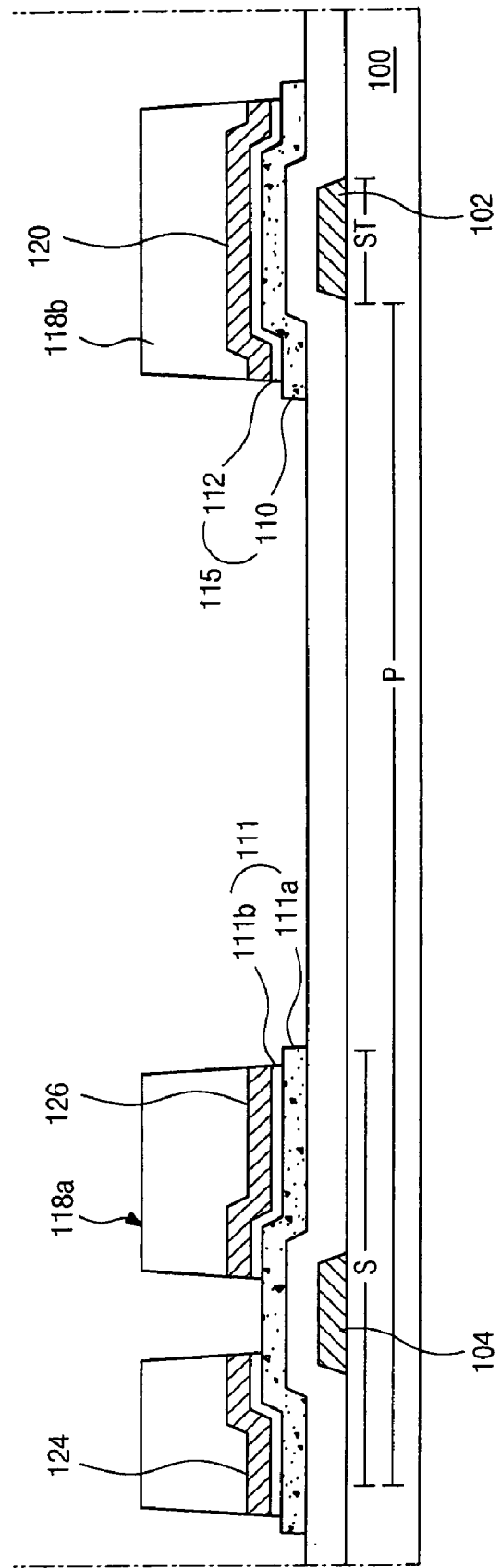
Figure 14B:
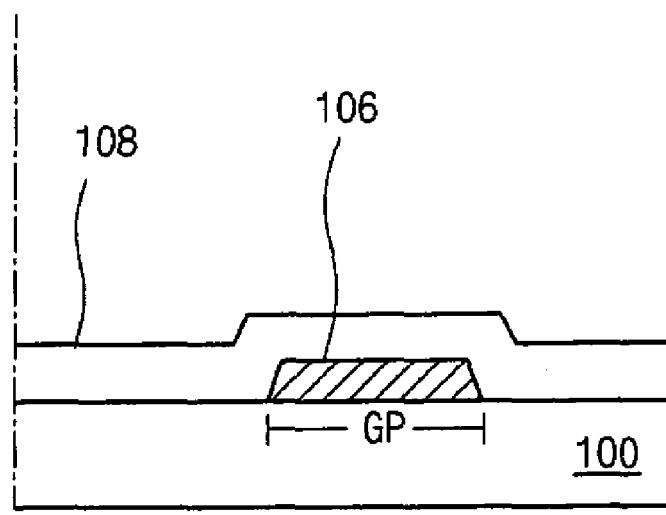
Figure 14C:
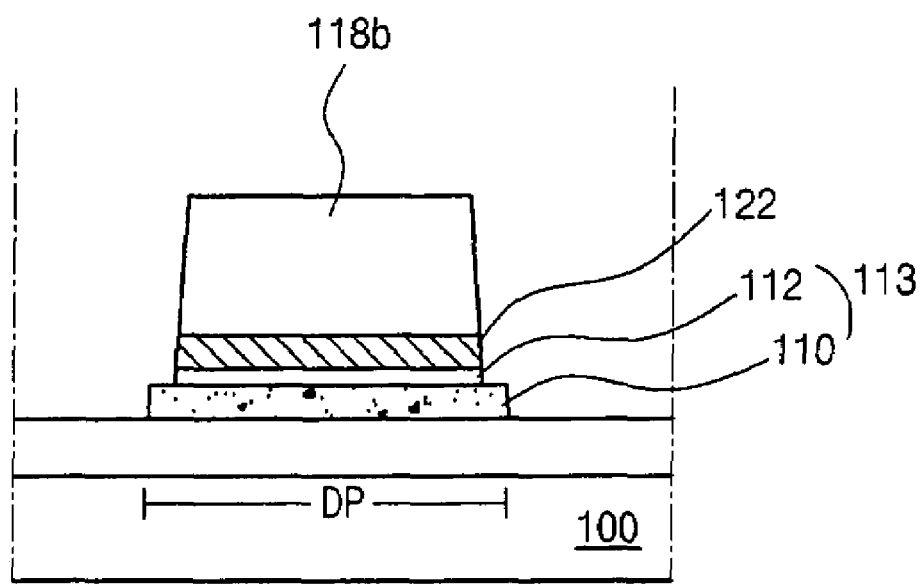

As illustrated in FIGS. 14A, 14B and 14C, the source and drain pattern 119 of FIG. 13A, which is exposed by the partially removed first photoresist pattern 118a, is etched to thereby form source and drain electrodes 124 and 126. Next, the impurity-doped amorphous silicon layer 112 of FIG. 13A exposed by the source and drain electrodes 124 and 126 are removed.

Figure 13C:
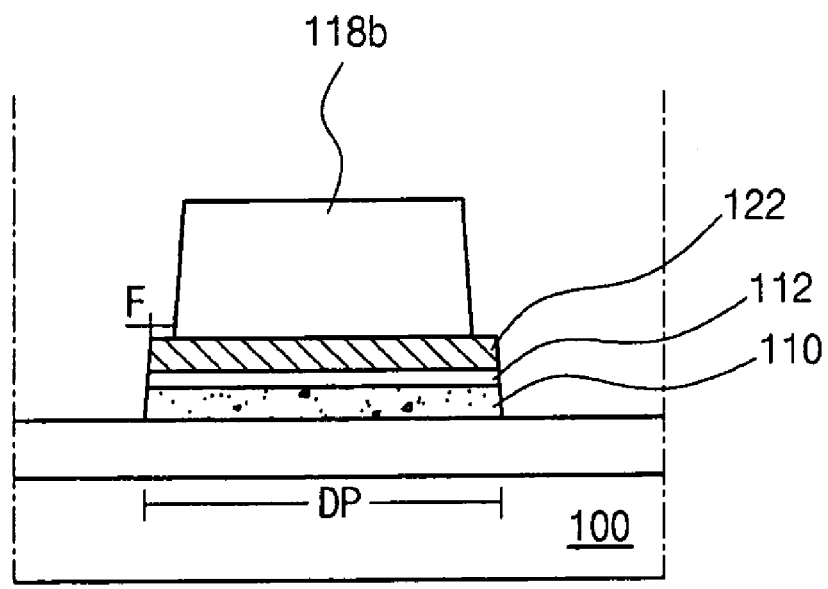

At this time, the peripheral portions F of the source and drain pattern 119, the metal pattern 120 and the data pad 122 of FIGS. 13A and 13C and corresponding parts of the impurity-doped amorphous silicon layer 112 of FIGS. 13A and 13C are also etched.

Furthermore, a first semiconductor pattern 111, a second semiconductor pattern 113 and a third semiconductor pattern 115 are formed under the source and drain electrodes 124 and 126, the data pad 122 and the metal pattern 120, respectively. Each semiconductor pattern 111, 113 and 115 includes the impurity-doped amorphous silicon layer 112 and the intrinsic amorphous silicon layer 110. The intrinsic amorphous silicon layer of the first semiconductor pattern 111 is referred as an active layer 111a, and the impurity-doped amorphous silicon layer of the first semiconductor pattern 11 is referred to as an ohmic contact layer 111b. Another semiconductor pattern including the impurity-doped amorphous silicon layer and the intrinsic amorphous silicon layer, which is connected to the first semiconductor pattern 111 and the second semiconductor pattern 113, is also formed under the data line. Next, the first and second photoresist patterns 118a and 118b are removed.

As shown in FIG. 14A, the active layer 11a extends beyond the left end of the source electrode 124 and the right end of the drain electrode 126. The active layer 11a also extends beyond the left end of ohmic contact layer 111b below the source electrode 124 and the right end of ohmic contact layer 111b below the drain electrode 126. The left portion and the right portion of the ohmic contact layer 111b are aligned with the source electrode 124 and the drain electrode 126, respectively.

As shown in FIG. 14A, in the storage region ST, the metal pattern 120 is aligned with the ohmic contact layer 112, and the semiconductor layer 110 extends beyond the two ends of the ohmic contact layer 112 and two ends of the metal pattern 120. The data pad 122, the ohmic contact layer 112 and the semiconductor layer 110 also have a similar structural arrangement in the data pad region DP as show in FIG. 14C.

Therefore, the source electrode 124, the drain electrode 126, the active layer 111a, the ohmic contact layer 111b, the storage capacitor $C_{ST}$, the data line and the data pad 122 are formed by using a single mask M. Compared to the complicated multiple-mask processes in the related art, this embodiment simply uses a single mask M in the second mask process to significantly simplify the process and reduce the costs.

Figure 15A:
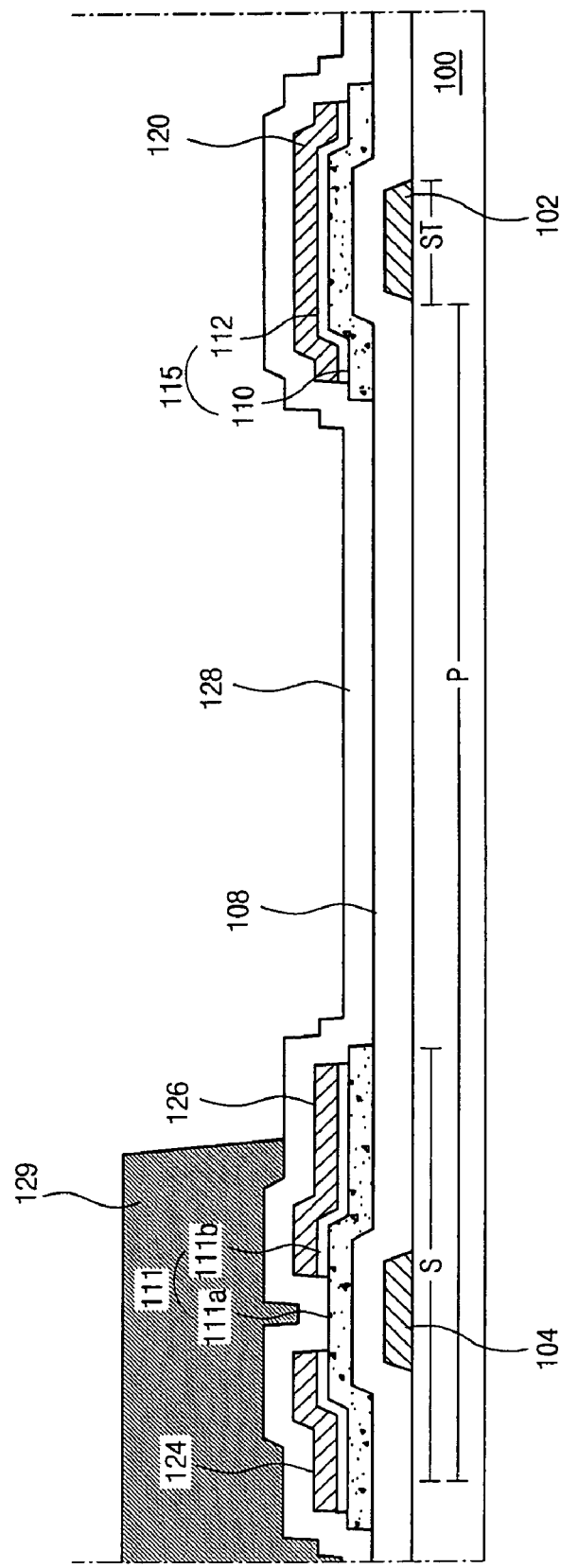
Figure 15B:
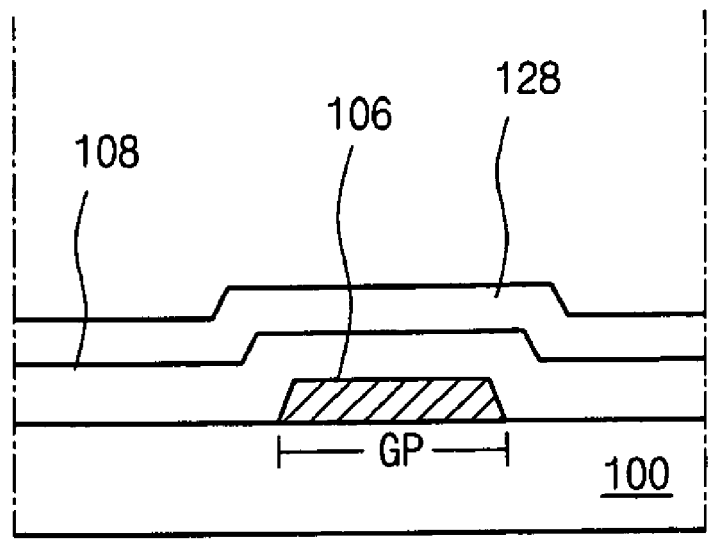
Figure 15C:
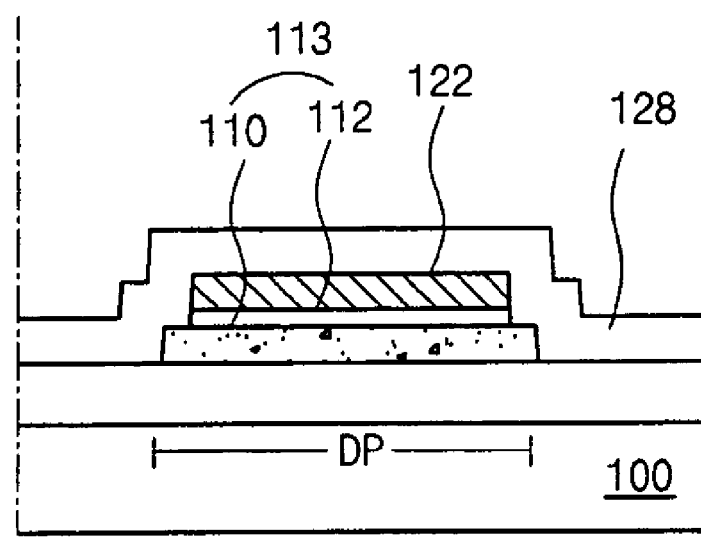

FIGS. 15A, 15B and 15C illustrate a third mask process and show cross-sectional views corresponding to the pixel region, the gate pad region and the data pad region, respectively.

In FIGS. 15A, 15B and 15C, a first passivation layer 128 is formed on the entire surface of the substrate 100 including the source and drain electrodes 124 and 126, the data pad 122 and the metal pattern 120 thereon by depositing an inorganic insulating material such as silicon nitride ($SiN_x$) or silicon oxide ($SiO_2$).

A black matrix 129 is formed on the first passivation layer 128 by sequentially coating and then patterning black resin through a third mask process. The black matrix 129 corresponds to the switching region S.

Figure 16A:
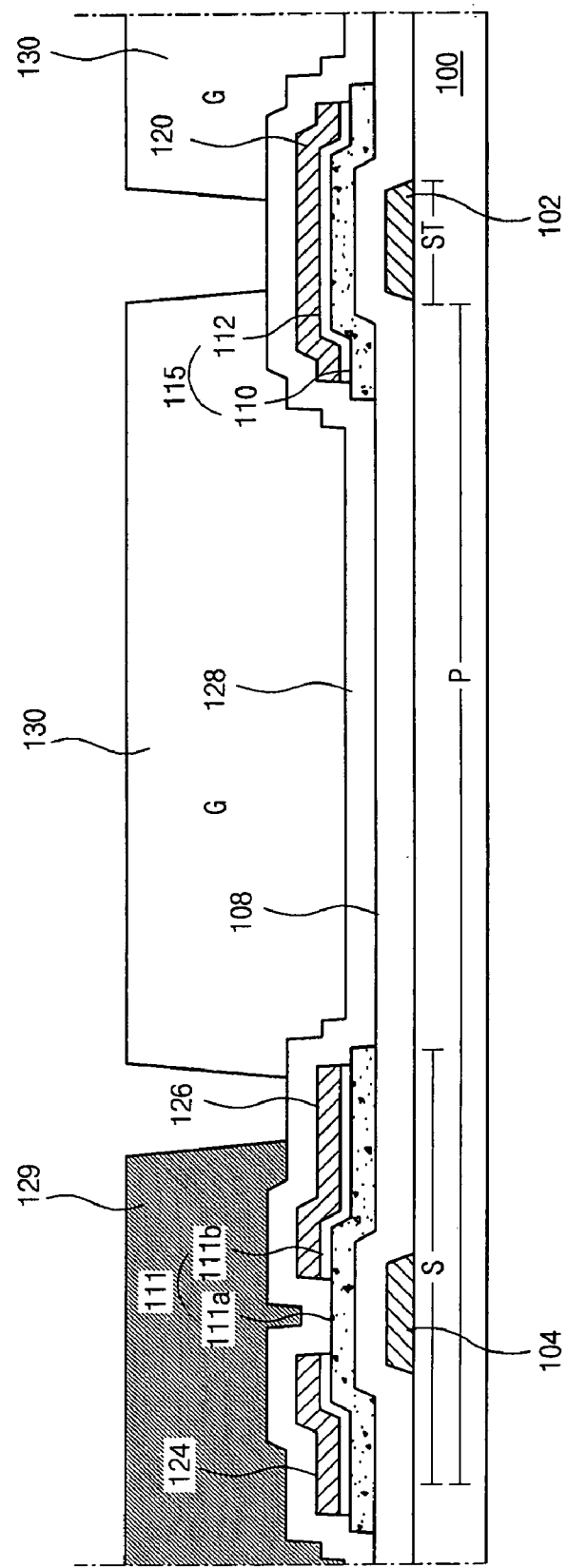
Figure 16B:
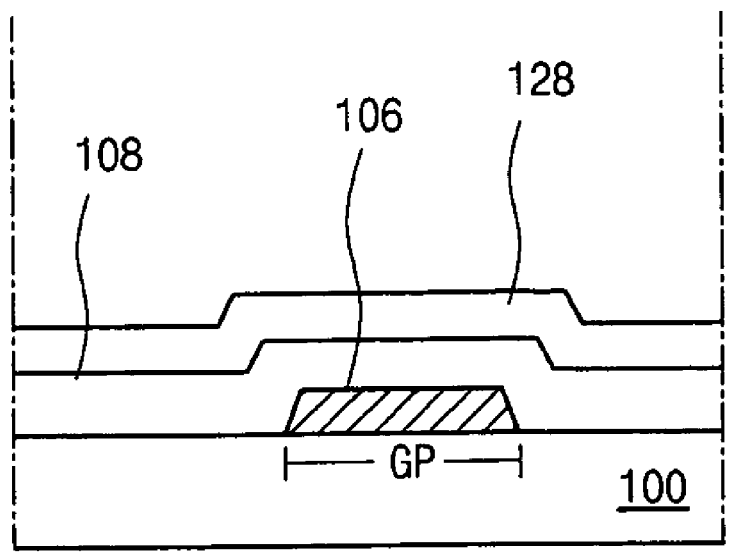
Figure 16C:
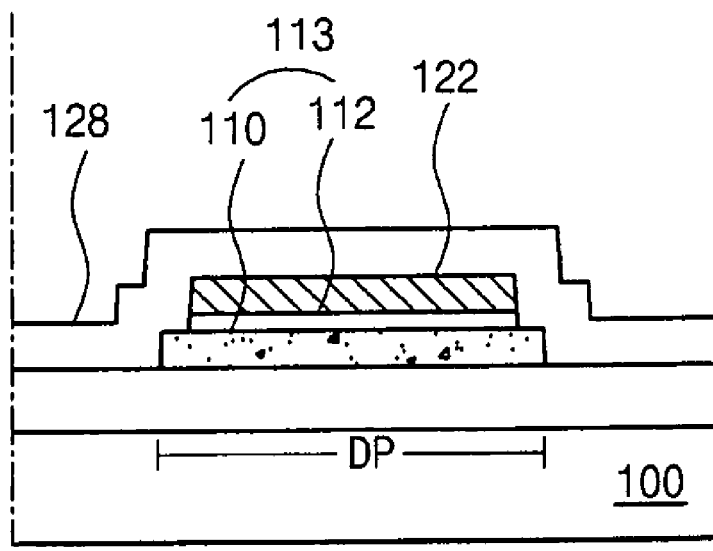

Next, FIGS. 16A, 16B and 16C illustrate a fourth mask process and show cross-sectional views corresponding to the pixel region, the gate pad region and the data pad region, respectively.

In FIGS. 16A, 16B and 16C, a color filter layer, for example, a green color filter 130, is formed on the first passivation layer 128 by sequentially coating and then patterning color resin through a fourth mask process. The color filter layer is formed in the pixel region P. The color filter layer includes red, green and blue color filters. Each color filter corresponds to one pixel region P. Although not shown in the drawings, red and blue color filters are formed through the same process as the green color filter 130. The color filter layer is not formed in the gate pad region GP and the data pad region DP.

Meanwhile, when the black matrix 129 and the color filter layer 130 are formed, portions of the first passivation layer 128 corresponding to a part of the drain electrode 126 and to a part of the metal pattern 120 are exposed. As shown in FIG. 16A, the color filter layer 130 is spaced apart from the black matrix 129 with a gap to expose the first passivation layer 128 in the gap.

FIGS. 17A, 17B and 17C through FIGS. 21A, 21B and 21C illustrate a fifth mask process and show cross-sectional views corresponding to the pixel region, the gate pad region and the data pad region, respectively.

Figure 17A:
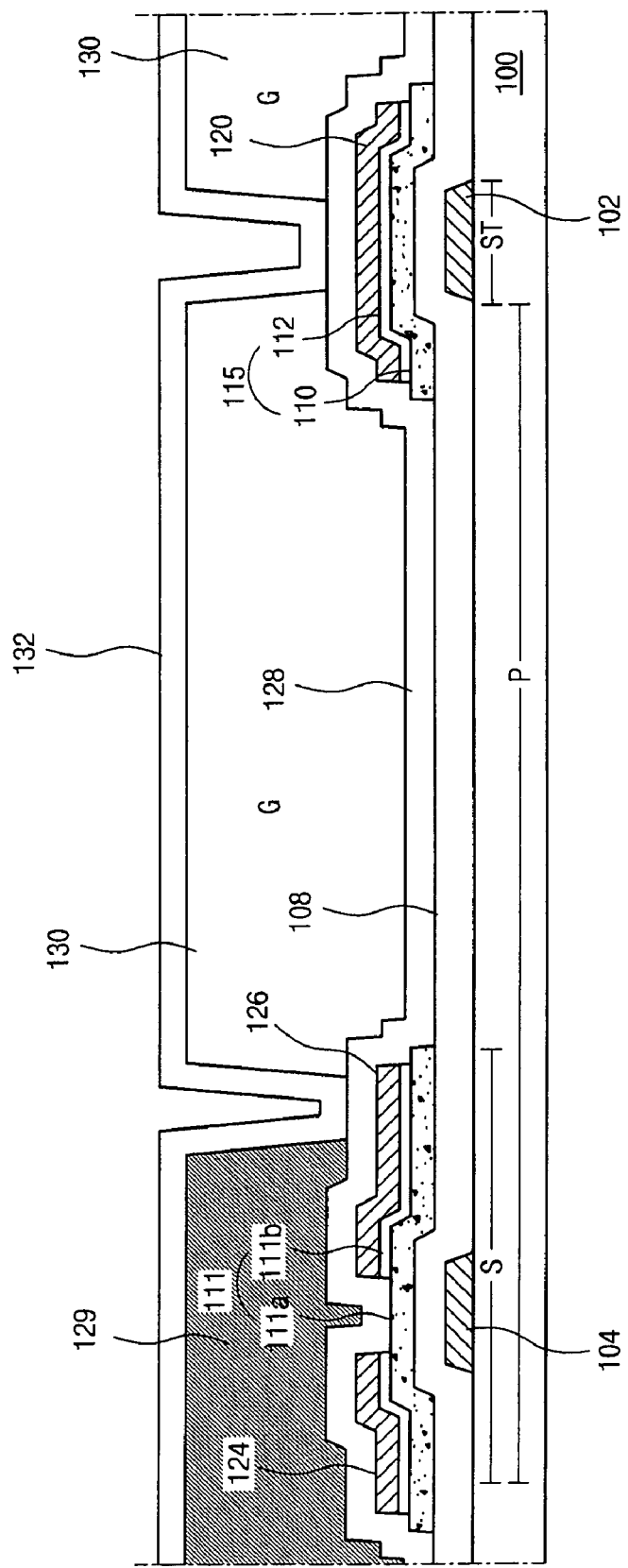
Figure 17B:
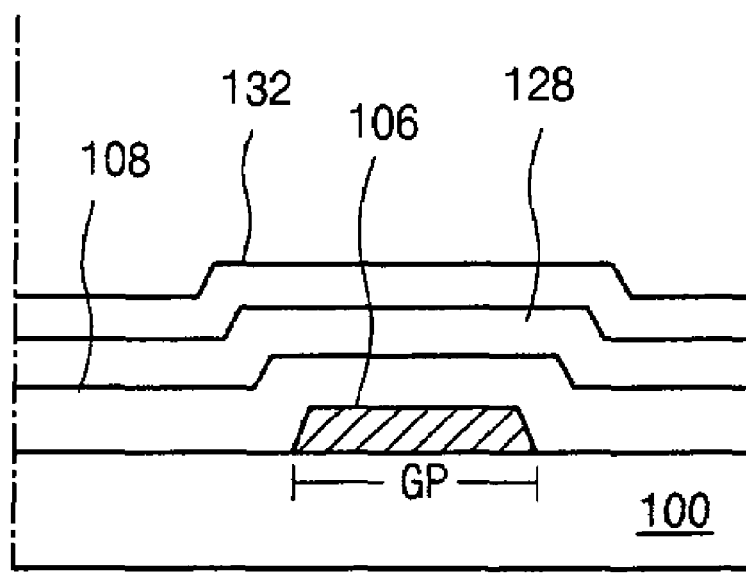
Figure 17C:
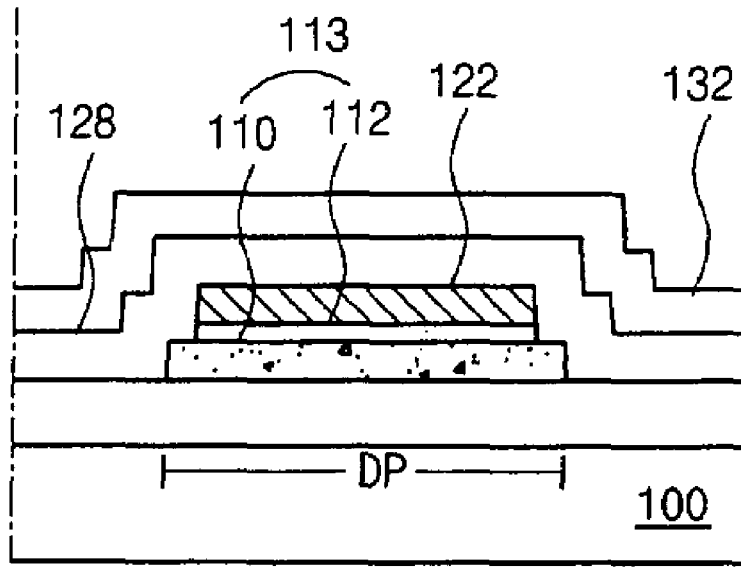

As illustrated in FIGS. 17A, 17B and 17C, a second passivation layer 132 is formed on the entire surface of the substrate 100 including the black matrix 129 and the color filter layer 130 thereon, and formed on the exposed portions of the first passivation layer 128 in the gap and above the metal pattern 120, by depositing an inorganic insulating material stated above.

Figure 18A:
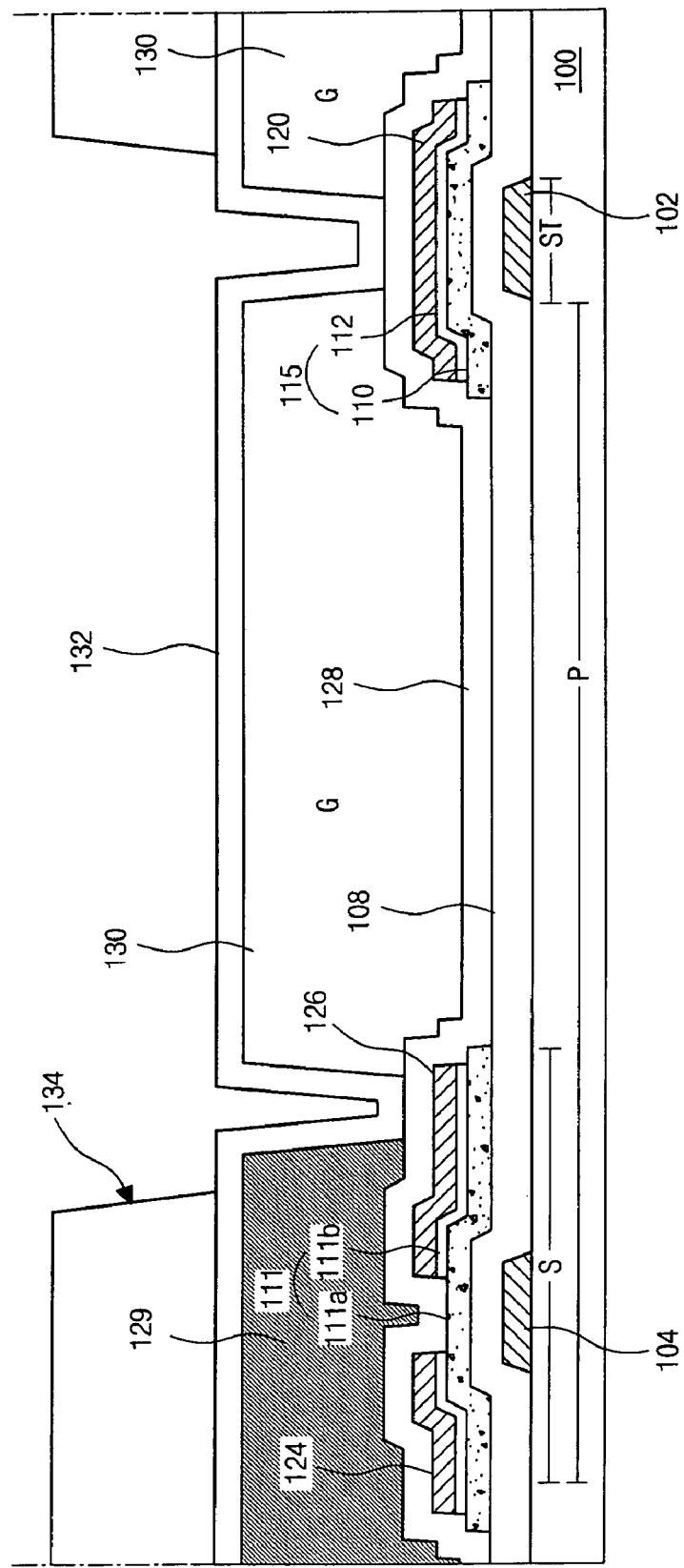
Figure 18B:
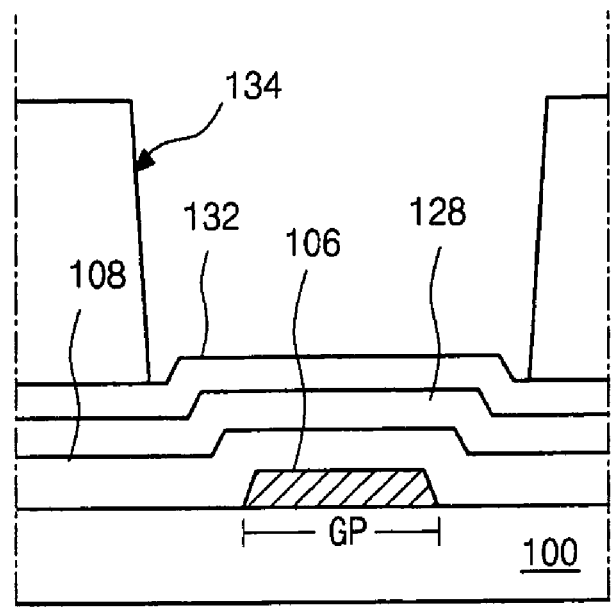
Figure 18C:
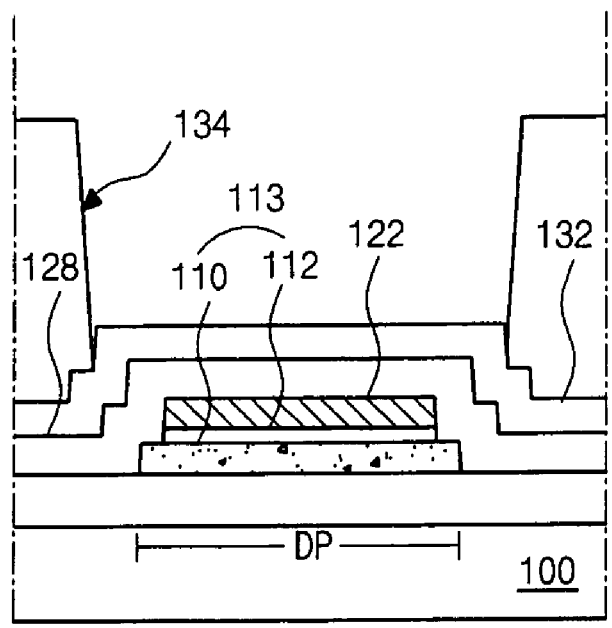

As illustrated in FIGS. 18A, 18B and 18C, a mask layer such as a photoresist pattern 134 is formed on the second passivation layer 132 by sequentially coating and then patterning photoresist through a fifth mask process. The photoresist pattern 134 exposes the second passivation layer 132 corresponding to the pixel region P, the part of the drain electrode 126, the part of the metal pattern 120, the gate pad 106, and the data pad 122.

Figure 19A:
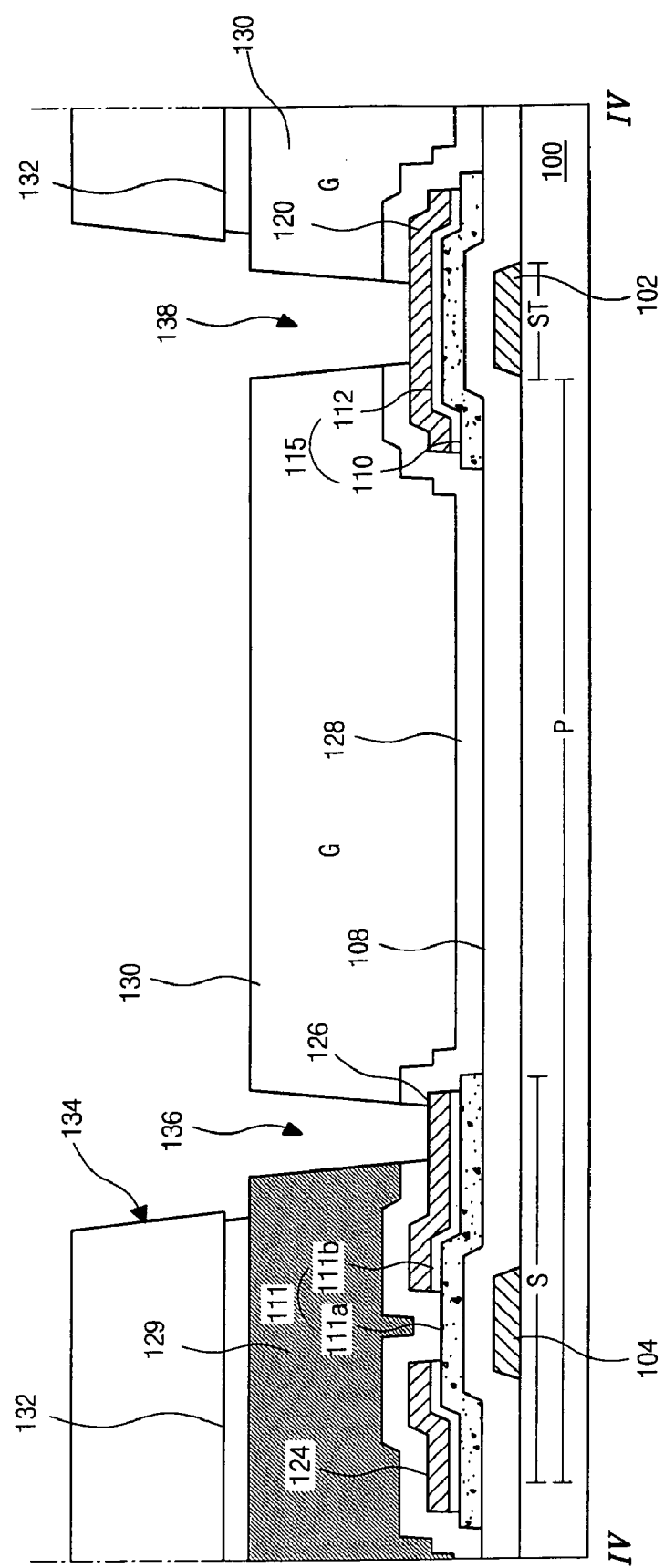
Figure 19B:
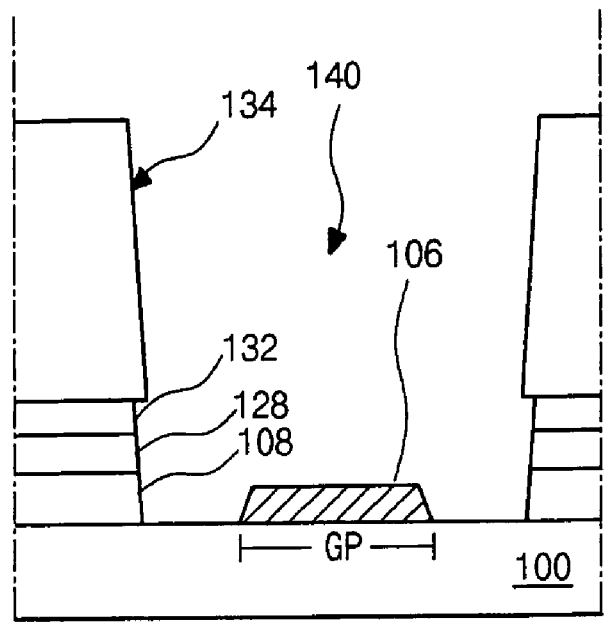
Figure 19C:
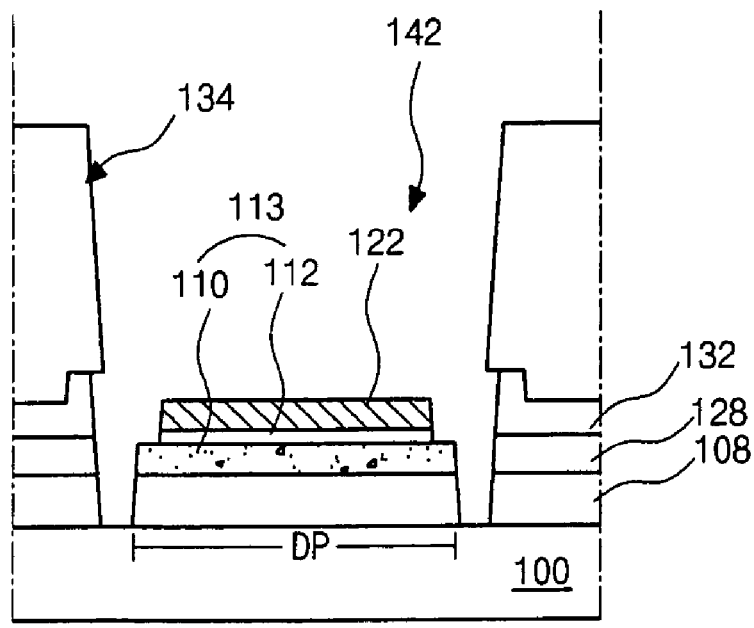

As illustrated in FIGS. 19A, 19B and 19C, the second passivation layer 132 exposed by the photoresist pattern 134 is removed to thereby expose the color filter layer 130. Furthermore, the first passivation layer 128 exposed after removing the exposed second passivation layer 132 is removed to thereby form a drain contact hole 136 and a storage contact hole 138. In the gate pad region GP and the data pad region DP, the gate insulating layer 108 is also removed with the first and second passivation layers 128 and 132 to thereby form a gate pad contact hole 140 entirely exposing the gate pad 106 and a data pad contact hole 142 entirely exposing the data pad 122. In the gate pad region GP and the data pad region DP, the substrate 100 may be exposed as shown in FIGS. 19B and 19C.

Figure 20A:
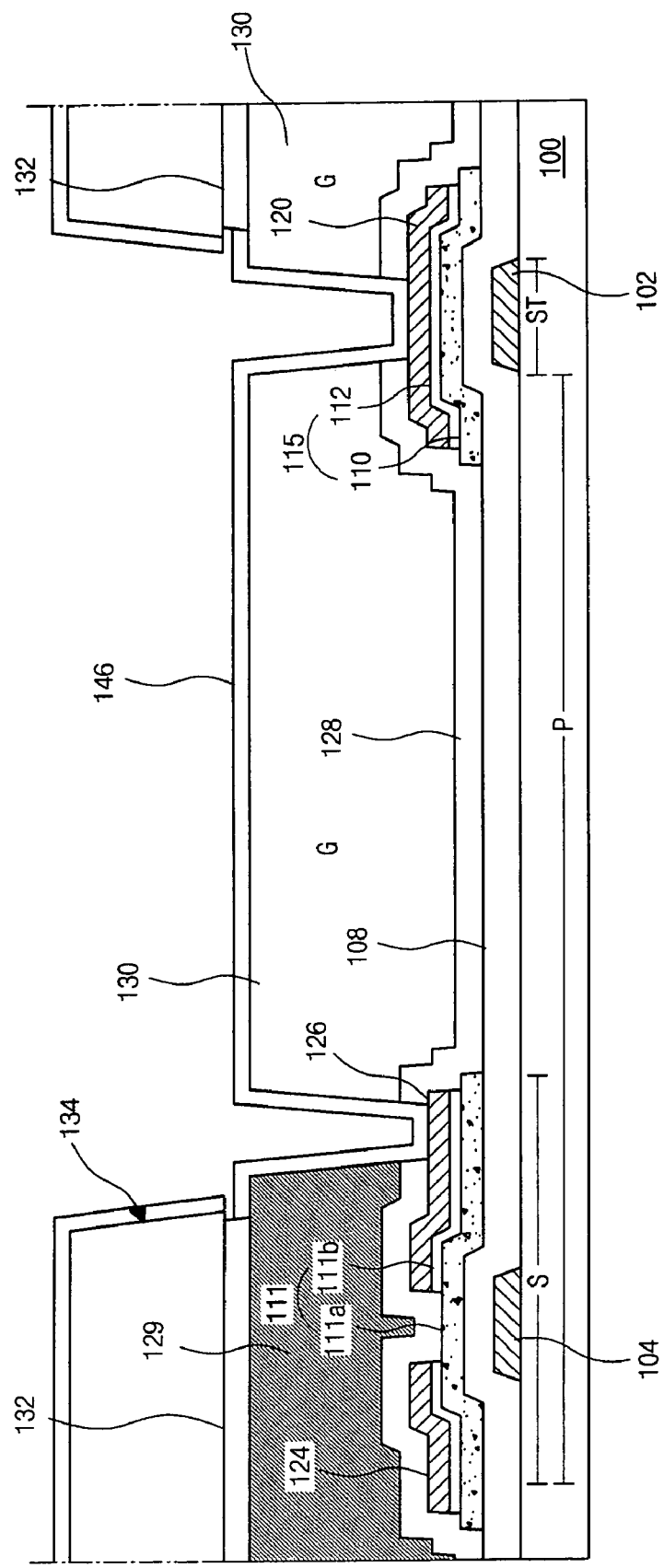
Figure 20B:
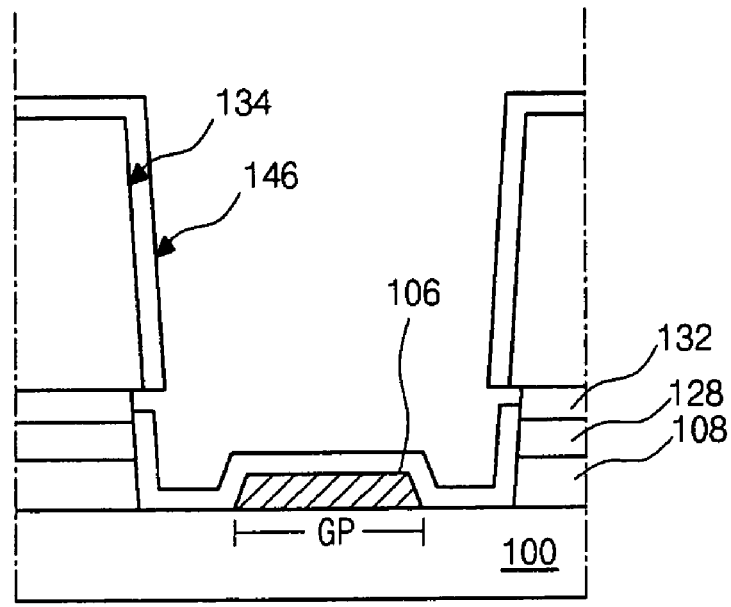
Figure 20C:
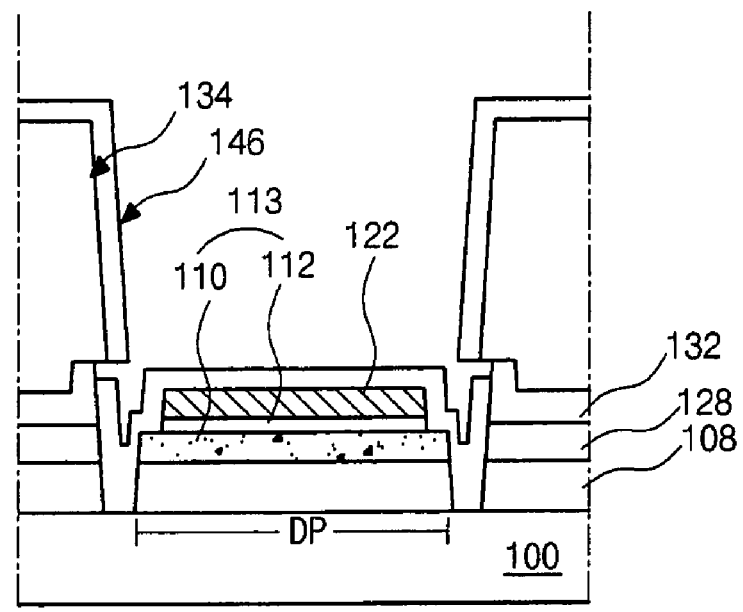

As illustrated in FIGS. 20A, 20B and 20C, a transparent conductive layer 146 is formed on substantially an entire surface of the substrate 100 including the photoresist pattern 134. The transparent conductive layer 146 is formed of a transparent conductive material such as indium tin oxide (ITO) or indium zinc oxide (IZO). Because of the thick photoresist pattern 134, a gap is formed between the transparent conductive layer 146 on the photoresist 132 and on the black matrix 129 as shown in FIG. 20A to expose a portion of the photoresist pattern 134. Similarly, a gap of the transparent conductive layer 146 is formed in the gate pad region and in the data pad region as shown in FIGS. 20B and 20C to expose a portion of the photoresist pattern 134.

Figure 21A:
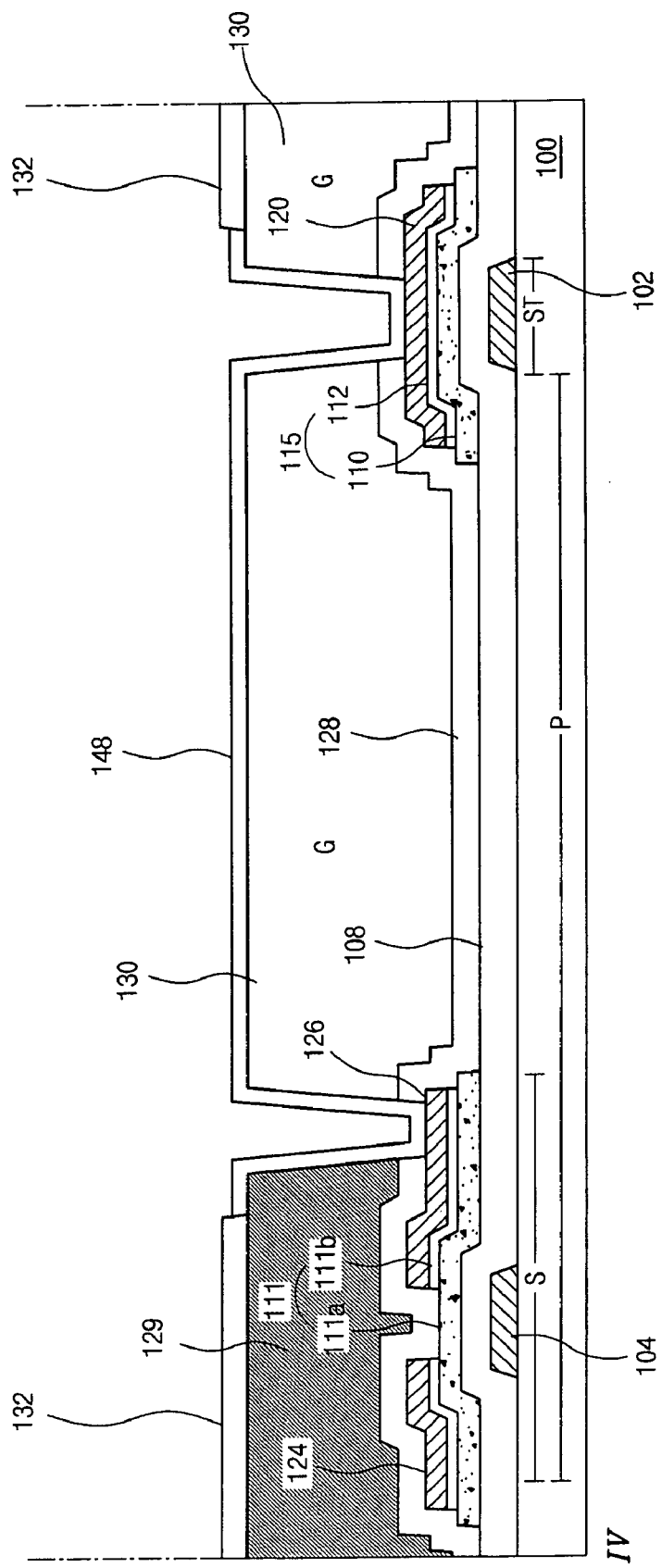
Figure 21B:
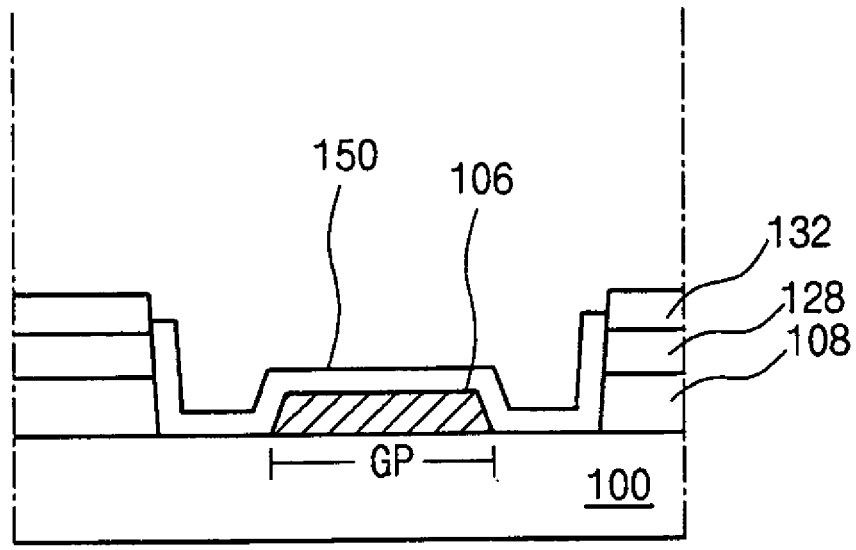
Figure 21C:
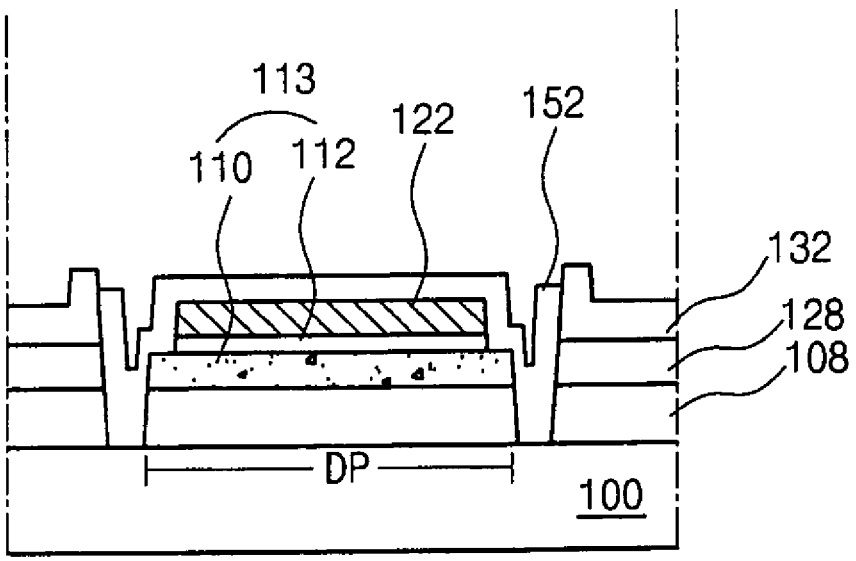

As illustrated in FIGS. 21A, 21B and 21C, the photoresist pattern 134 of FIGS. 20A, 20B and 20C and the transparent conductive layer 146 over the photoresist pattern 134 of FIGS. 20A, 20B and 20C are removed to thereby form a pixel electrode 148 in the pixel region P. In an embodiment, the substrate including the transparent conductive layer 146 with the gap is dipped in a stripper for the photoresist pattern 134, and the stripper permeates through the gap to remove the photoresist pattern 134 with the transparent conductive layer 146 on the photoresist pattern 134. This is the so-called lift-off method. The pixel electrode 148 contacts the drain electrode 126 and the metal pattern 120. As shown in FIG. 21A, the pixel electrode 148 also contacts a portion of the top surface of the black matrix 129. At the same time, a gate pad terminal 150 and a data pad terminal 152 of island shapes are formed in the gate pad region GP and the data pad region DP, respectively. The gate pad terminal 150 covers and contacts the entire top surface and sidewalls of the gate pad 106. The data pad terminal 152 covers and contacts the entire top surface and sidewalls of the data pad 122. The gate pad terminal 150 and the data pad terminal 152 also contact the substrate 100.

Therefore, the pixel electrode 148 is formed by using a single mask for patterning the photoresist pattern 134. Compared to the complicated multiple-mask processes in the related art, this embodiment simply uses a single mask in the fifth mask process to significantly simplify the process and reduce the costs.

The array substrate having the COT structure according to the present invention is manufactured through the above-mentioned processes, that is, a five-mask process. The array substrate is attached with a substrate including a transparent common electrode, thereby fabricating a liquid crystal display device.

Meanwhile, a columnar spacer is further formed on the array substrate of the present invention.

Figure 22A:
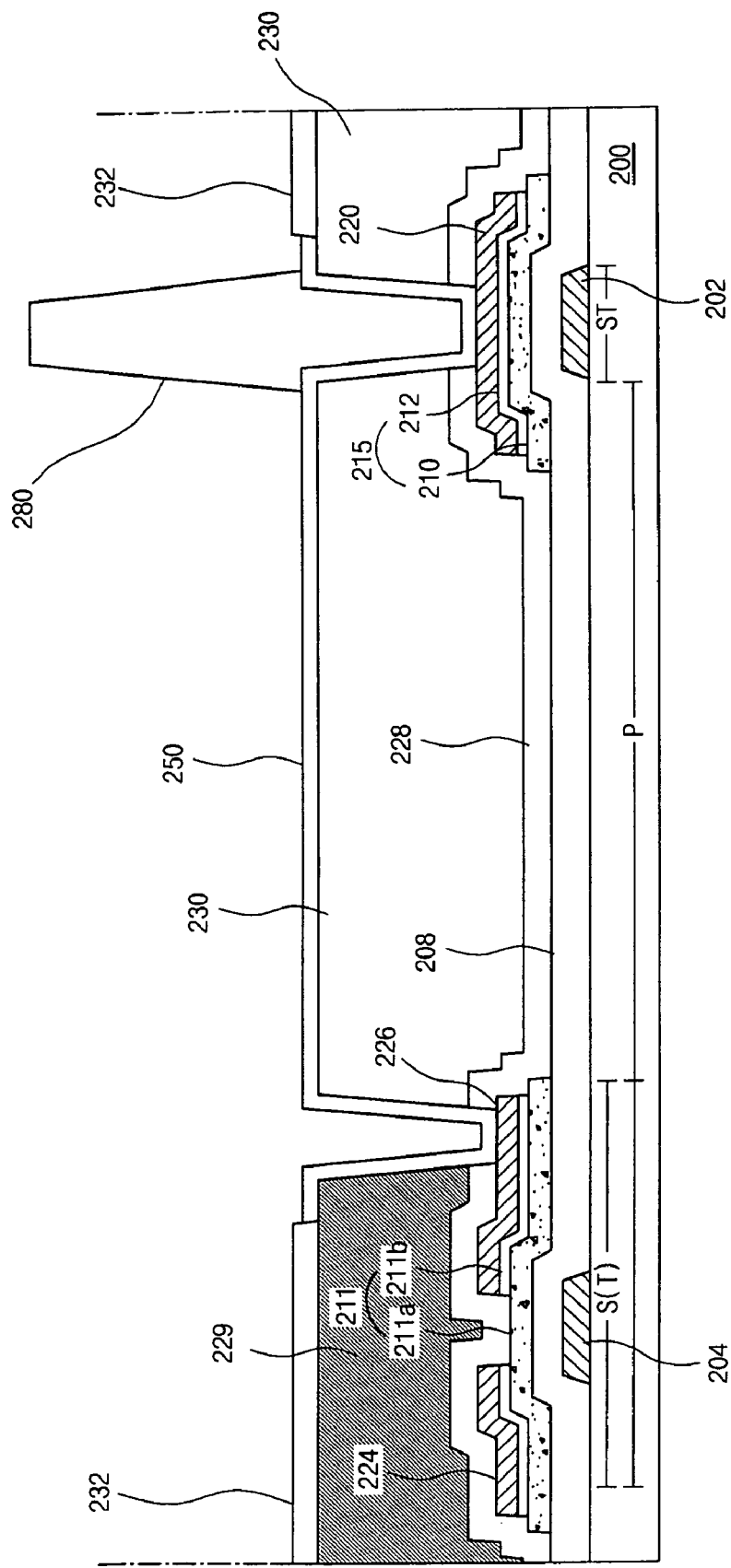
FIGS. 22A, 22B and 22C show cross-sectional views illustrating an array substrate including a columnar spacer according to an embodiment of the present invention.
Figure 22B:
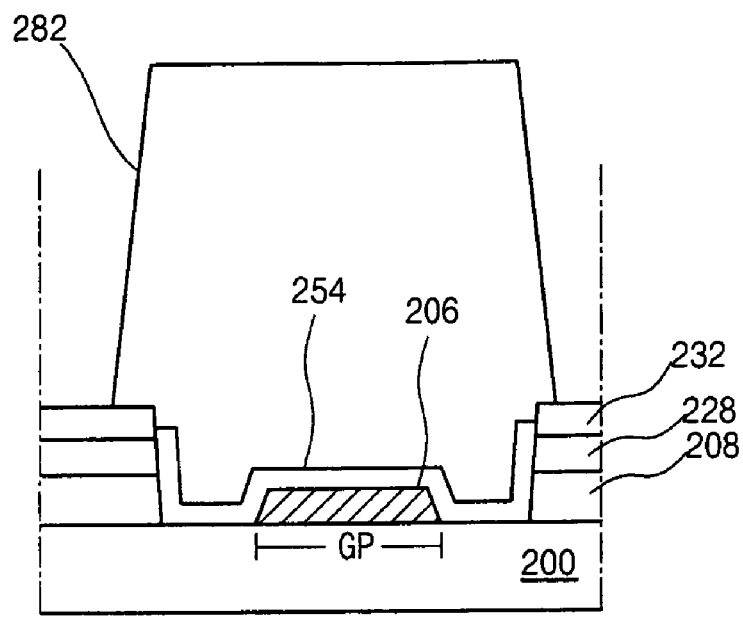
Figure 22C:
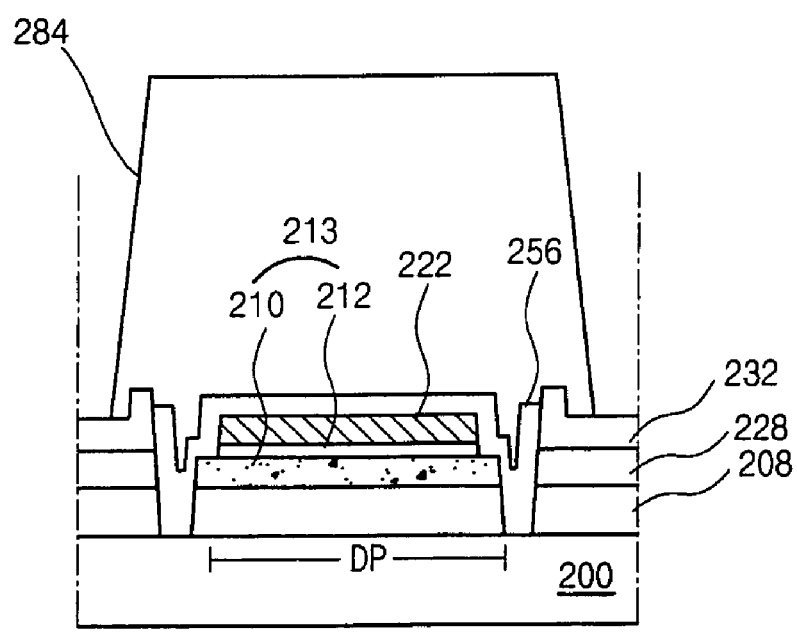

FIGS. 22A, 22B and 22C illustrate an array substrate including a columnar spacer according to an embodiment of the present invention and show cross-sectional views corresponding to a pixel region, a gate pad region and a data pad region, respectively.

In FIGS. 22A, 22B and 22C, a pixel region P including a switching region S, a storage region ST, a gate pad region GP and a data pad region DP are defined on a substrate 200.

A gate line 202, a gate electrode 204 and a gate pad 206 are formed on the substrate 200. The gate electrode 204 is disposed in the switching region S, a portion of the gate line 202 is disposed in the storage region ST, and the gate pad 206 is disposed in the gate pad region GP. Although not shown in the drawings, the gate electrode 204 is connected to the gate line 202, and the gate pad 206 is formed at one end of the gate line 202. A gate insulating layer 208 is formed on the gate line 202, the gate electrode 204 and the gate pad 206.

A first semiconductor pattern 211, a second semiconductor pattern 213 and a third semiconductor pattern 215 are formed on the gate insulating layer 208 in the switching region S, the data pad region DP and the storage region ST, respectively. Each of the first, second and third semiconductor patterns 211, 213 and 215 includes a semiconductor layer such as an intrinsic amorphous silicon layer 210 and an ohmic contact layer such as an impurity-doped amorphous silicon layer 212. The intrinsic amorphous silicon layer of the first semiconductor pattern 211 is referred to as an active layer 211a, and the impurity-doped amorphous silicon layer the layer of the first semiconductor pattern 211 is referred to as an ohmic contact layer 211b.

A source electrode 224 and a drain electrode 226 are formed on the first semiconductor pattern 211, a data pad 222 is formed on the second semiconductor pattern 213, and a metal pattern 220 is formed on the third semiconductor pattern 215. Although not shown, a data line is formed in the same layer as the source and drain electrodes 224 and 226, the data pad 222 and the metal pattern 220. The data line is connected to the source electrode 224, and the data pad 222 is disposed at one end of the data line. The metal pattern 220 overlaps the gate line 202, and the metal pattern 220 and the gate line 202 function as first and second capacitor electrodes to thereby form a storage capacitor. As shown in FIG. 22A, the ohmic contact layer 212 and the semiconductor layer 210 are between the metal pattern 220 and the gate line 202.

The gate electrode 204, the first semiconductor pattern 211, the source electrode 224 and the drain electrode 226 constitute a thin film transistor T.

A first passivation layer 228 is formed on the source and drain electrodes 224 and 226, the data pad 222 and the metal pattern 220. A black matrix 229 is formed on the first passivation layer 228 over the thin film transistor T in the switching region S. A color filter layer 230 is formed on the first passivation layer 228 in the pixel region P excluding the switching region S. The color filter layer 230 includes color filters of red, green and blue, and each color filter corresponds to the pixel region P. The color filters are sequentially formed in respective pixel regions.

A second passivation layer 232 is formed on the black matrix 229 and the color filter layer 230. The second passivation layer 232 exposes the pixel region P excluding the switching region S, the storage region ST, the gate pad region GP and the data pad region DP.

A pixel electrode 250, a gate pad terminal 254 and a data pad terminal 256 are formed on the black matrix 229 and the color filter layer 230 in regions exposed by the second passivation layer 232. The pixel electrode 250, the gate pad terminal 254 and the data pad terminal 256 are formed of a transparent conductive material. The pixel electrode 250 contacts the drain electrode 226 and the metal pattern 220. The gate pad terminal 254 contacts the gate pad 206, and the data pad terminal 256 contacts the data pad 222.

A columnar spacer 280 is formed over the substrate 200 including the pixel electrode 250, and the columnar spacer 280 corresponds to the gate line 202 and the data line (not shown). The columnar spacer 280 is formed by sequentially coating and then patterning photosensitive or non-photosensitive resin on substantially an entire surface of the substrate 200 through a photolithographic process using a mask. As shown in FIG. 22A, the columnar spacer 280 extends from the storage contact hole to above the pixel electrode 250.

A first blocking layer 282 and a second blocking layer 284 are formed over the gate pad 206 and the data pad 222 in the same layer as the columnar spacer 280. When the gate pad 206 and the data pad 222 are formed of a metallic material including aluminum (Al), a galvanic phenomenon may occur between the gate pad 206 and the gate pad terminal 254 or between the data pad 222 and the data pad terminal 256 due to an etchant for the spacer 280, and the gate pad 206 or the data pad 222 may be removed. Thus, to prevent this problem, the first blocking layer 282 covers the gate pad 206, and the second blocking layer 284 covers the data pad 222.

For external connection to the gate pad terminal 254 and the data pad terminal 256, the first and second blocking layers 282 and 284 may be removed in the next step.

The array substrate of FIGS. 22A, 22B and 22C except the columnar spacer 280 and the first and second blocking layers 282 and 284 may be manufactured through the same processes as mentioned above.

Figure 23A:
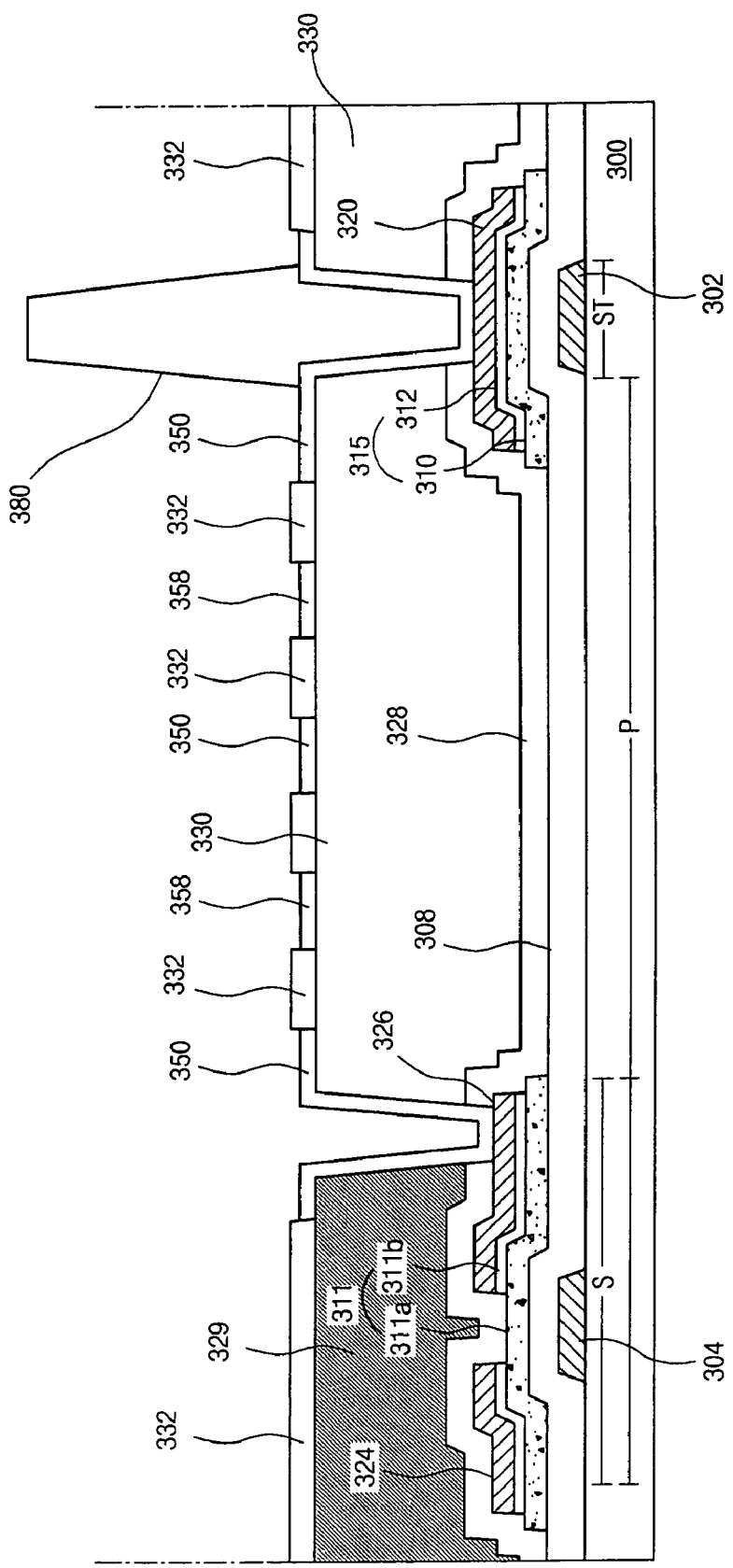
FIGS. 23A, 23B and 23C show cross-sectional views illustrating an array substrate according to another embodiment of the present invention.
Figure 23B:
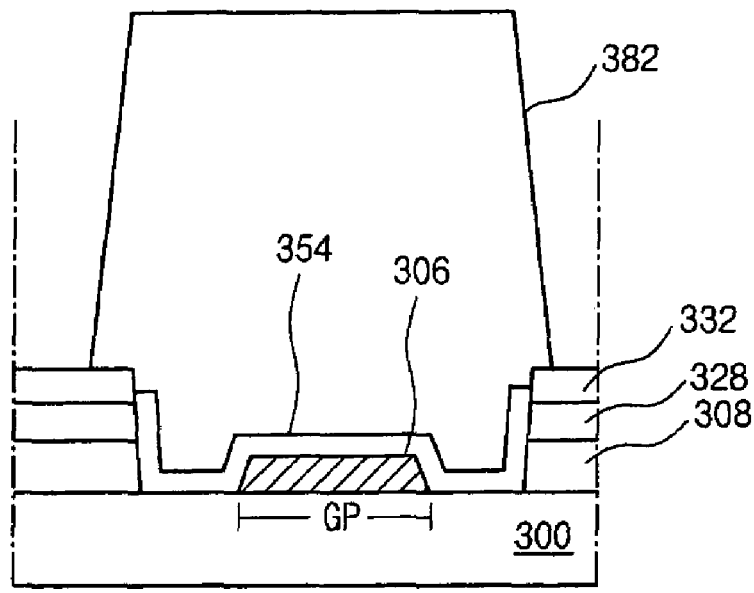
Figure 23C:
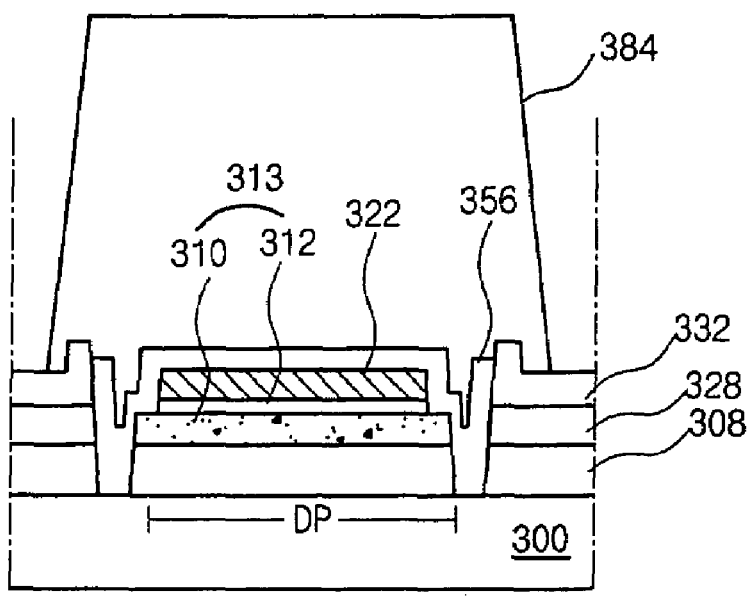

FIGS. 23A, 23B and 23C illustrate an array substrate according to another embodiment of the present invention. FIGS. 23A, 23B and 23C show cross-sectional views corresponding to a pixel region, a gate pad region and a data pad region, respectively. The array substrate includes a pixel electrode and a common electrode and further includes a columnar spacer.

In FIGS. 23A, 23B and 23C, a pixel region P including a switching region S, a storage region ST, a gate pad region GP and a data pad region DP are defined on a substrate 300.

A gate line 302, a gate electrode 304 and a gate pad 306 are formed on the substrate 300. The gate electrode 304 is disposed in the switching region S, a portion of the gate line 302 is disposed in the storage region ST, and the gate pad 306 is disposed in the gate pad region GP. Although not shown in the drawings, the gate electrode 304 is connected to the gate line 302, and the gate pad 306 is formed at one end of the gate line 302. A gate insulating layer 308 is formed on the gate line 302, the gate electrode 304 and the gate pad 306.

A first semiconductor pattern 311, a second semiconductor pattern 313 and a third semiconductor pattern 315 are formed on the gate insulating layer 308 in the switching region S, the data pad region DP and the storage region ST, respectively. Each of the first, second and third semiconductor patterns 311, 313 and 315 includes a semiconductor layer such as an intrinsic amorphous silicon layer 310 and an ohmic contact layer such as an impurity-doped amorphous silicon layer 312. The intrinsic amorphous silicon layer of the first semiconductor pattern 311 is referred to as an active layer 311a, and the impurity-doped amorphous silicon layer the layer of the first semiconductor pattern 311 is referred to as an ohmic contact layer 311b.

A source electrode 324 and a drain electrode 326 are formed on the first semiconductor pattern 311, a data pad 322 is formed on the second semiconductor pattern 313, and a metal pattern 320 is formed on the third semiconductor pattern 315. Although not shown, a data line is formed in the same layer as the source and drain electrodes 324 and 326, the data pad 322 and the metal pattern 320. The data line crosses the gate line 302 and is connected to the source electrode 324. The data pad 322 is disposed at one end of the data line. The metal pattern 320 overlaps the gate line 302, and the metal pattern 320 and the gate line 302 function as first and second capacitor electrodes to thereby form a storage capacitor. As shown in FIG. 23A, the ohmic contact layer 312 and the semiconductor layer 310 are between the metal pattern 320 and the gate line 302.

The gate electrode 304, the first semiconductor pattern 311, the source electrode 324 and the drain electrode 326 constitute a thin film transistor.

A first passivation layer 328 is formed on the source and drain electrodes 324 and 326, the data pad 322 and the metal pattern 320. A black matrix 329 is formed on the first passivation layer 328 over the thin film transistor in the switching region S. A color filter layer 330 is formed on the first passivation layer 328 in the pixel region P excluding the switching region S. The color filter layer 330 includes color filters of red, green and blue, and each color filter corresponds to the pixel region P. The color filters are sequentially formed in respective pixel regions.

A second passivation layer 332 is formed on the black matrix 329 and the color filter layer 330. The second passivation layer 332 exposes the pixel region P excluding the switching region S, the storage region ST, the gate pad region GP and the data pad region DP. The second passivation layer 332 is patterned in the pixel region P and selectively exposes the color filter layer 330.

A pixel electrode 350, a common electrode 358, a gate pad terminal 354 and a data pad terminal 356 are formed on the black matrix 329 and the color filter layer 330 in regions exposed by the second passivation layer 332. The pixel electrode 350 and the common electrode 358 are disposed in the pixel region P, and the pixel electrode 350 and the common electrode 358 are coplanar, parallel to, and spaced apart from each other. The pixel electrode 350 and the common electrode 358 are disposed alternately in the pixel region P to form the in-plane electric field. Each of the pixel electrode 350 and the common electrode 358 includes a plurality of portions. The pixel electrode 350 contacts the drain electrode 326 and the metal pattern 320. The gate pad terminal 354 contacts the gate pad 306, and the data pad terminal 356 contacts the data pad 322. The pixel electrode 350, the common electrode 358, the gate pad terminal 354 and the data pad terminal 256 are formed of a transparent conductive material.

A common line (not shown) may be formed parallel to the gate line 302 and may be connected to the common electrode 358.

A columnar spacer 380 is formed over the substrate 300 including the pixel electrode 350, and the columnar spacer 380 corresponds to the gate line 302 and the data line (not shown). The columnar spacer 380 is formed by sequentially coating and then patterning photosensitive or non-photosensitive resin on substantially an entire surface of the substrate 200 through a photolithographic process using a mask.

A first blocking layer 382 and a second blocking layer 384 are formed over the gate pad 306 and the data pad 322 in the same layer as the columnar spacer 380. When the gate pad 306 and the data pad 322 are formed of a metallic material including aluminum (Al), a galvanic phenomenon may occur between the gate pad 306 and the gate pad terminal 354 or between the data 322 and the data pad terminal 356 due to an etchant for the spacer 380, and the gate pad 306 or the data pad 322 may be removed. Thus, to prevent this problem, the first blocking layer 382 covers the gate pad 306, and the second blocking layer 384 covers the data pad 322. In addition, another blocking layer may be formed over one end of the common line (not shown).

For external connection to the gate pad terminal 354 and the data pad terminal 356, the first and second blocking layers 382 and 384 may be removed in the next step.

The array substrate of FIGS. 23A, 23B and 23C except the columnar spacer 380 and the first and second blocking layers 382 and 384 may be manufactured through the same processes as mentioned above.

In the above embodiments of the present invention, since an attaching margin can be used as an aperture area, an aperture ratio is increased, and brightness is improved.

The array substrate is manufactured through simplified processes, and manufacturing costs and time are reduced. In addition, problems due to the complicated processes can be significantly reduced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A liquid crystal display device, comprising:
    a substrate;
    a gate line and a gate electrode on the substrate;
    a gate insulating layer on the gate line and the gate electrode;
    an active layer on the gate insulating layer over the gate electrode;
    an ohmic contact layer on the active layer;
    a source electrode, a drain electrode and a data line on the ohmic contact layer, the data line crossing the gate line to define a pixel region;
    a first passivation layer on the source and drain electrodes and the data line;
    a black matrix on the first passivation layer over the active layer;
    a color filter layer on the first passivation layer in the pixel region;
    a second passivation layer on the black matrix and the color filter layer, the second passivation layer exposing the color filter layer in the pixel region; and
    a pixel electrode on the exposed color filter layer in the pixel region, the pixel electrode connected to the drain electrode, wherein the pixel electrode is disposed in a region excluding the second passivation layer such that the pixel electrode does not overlap the second passivation layer.

2. The device according to claim 1, wherein the pixel electrode is disposed on a same layer as the second passivation layer.

3. The device according to claim 1, further comprising a columnar spacer over the gate and data lines.

4. The device according to claim 1, wherein the second passivation layer is selectively patterned in the pixel region and selectively exposes the color filter layer.

5. The device according to claim 4, further comprising a common electrode on the selectively exposed color filter layer in the pixel region, the common electrode spaced apart from and coplanar with the pixel electrode.

* * * * *